United States Patent [19]

Strumolo

[11] Patent Number: 5,568,404
[45] Date of Patent: Oct. 22, 1996

[54] METHOD AND SYSTEM FOR PREDICTING SOUND PRESSURE LEVELS WITHIN A VEHICLE DUE TO WIND NOISE

[75] Inventor: Gary S. Strumolo, Beverly Hills, Mich.

[73] Assignee: Ford Motor Company, Dearborn, Mich.

[21] Appl. No.: 328,308

[22] Filed: Oct. 24, 1994

[51] Int. Cl.$^6$ ................................... G06G 7/48
[52] U.S. Cl. ............................. 364/558; 364/578
[58] Field of Search ........................ 364/558, 556, 364/574, 508, 551.01, 552, 554, 578, 580; 73/37

[56] References Cited

U.S. PATENT DOCUMENTS

| | | | |
|---|---|---|---|
| 3,875,706 | 4/1975 | Okawa | 52/172 |
| 3,904,456 | 9/1975 | Schwartz | 156/71 |
| 4,553,354 | 11/1985 | Barbero | 49/431 |
| 4,571,886 | 2/1986 | Shiraishi | 49/374 |
| 5,097,512 | 3/1992 | Batey | 381/58 |

OTHER PUBLICATIONS

"The Transmission Of Aerodynamically–Generated Noise Through Panels In Automobiles", by John R. Callister et al., Second International Congress On Recent Developments In Air– And Structure–Borne Sound And Vibration, Mar. 4–6, 1992, Auburn University, USA, pp. 1535–1542.

*Primary Examiner*—James P. Trammell
*Attorney, Agent, or Firm*—Kevin G. Mierzwa; Roger L. May

[57] ABSTRACT

A programmable digital computer system is utilized for predicting sound pressure levels (SPLs) within a vehicle due to wind noise by utilizing data representing pressure spectra for vortex, reattached and turbulent boundary layer flows over a glass side window of the vehicle. The method and system preferably utilize data representing physical properties of at least one door seal of the vehicle. A set of pressure coefficients is determined so that a vortex area in turn can be determined and utilized during computation of the SPLs. Plots of the SPLs over a predetermined frequency range can be displayed for a driver's ear position as well as for a passenger's ear position within the vehicle.

18 Claims, 22 Drawing Sheets

| body region | are doors taped? | door gap (mm) | <Cp> along it: | # seal walls (2,3 or 4) | zero TL critical frequencies | | | margin frequencies | geom. | Gaussian amplitudes | | | |
|---|---|---|---|---|---|---|---|---|---|---|---|---|---|
| | | | | | #1 | #2 | #3 | | | driver | rear pass | driver | rear pass |
| A-Pillar: | yes no | 5 | -0.5 | 2 | 721 | ###### | ###### | 2,694 | 11,433 | 1.5 | 0.5 | 0.8 | 0.3 |
| B-Pillar: | yes no | 5 | -0.2 | 2 | 721 | ###### | ###### | 2,410 | 11,433 | 3.0 | 2.0 | 1.3 | 0.5 |
| C-Pillar: | yes no | 5 | -0.3 | 2 | 721 | ###### | ###### | 2,508 | 11,433 | 1.0 | 3.0 | 0.8 | 1.0 |

NOTE: tape C-Pillar for a 2-door vehicle seal contact (poor=0, good=1, open=-.5) 1

Vehicle speed (kph) 160 in mph: 100

Door Tape:

| | |
|---|---|
| 125 | 0.32 0.21 |
| 160 | 0.41 0.27 |
| 200 | 0.53 0.35 |
| 250 | 0.73 0.48 |
| 315 | 1.04 0.68 |
| 400 | 1.50 0.98 |
| 500 | 2.14 1.40 |
| 630 | 2.79 1.84 |
| 800 | 2.79 2.01 |
| 1000 | 2.29 1.69 |
| 1250 | 1.65 1.51 |
| 1600 | 2.41 2.45 |
| 200 | 4.21 4.30 |
| 2500 | 5.42 5.46 |
| 3150 | 3.56 3.49 |
| 4000 | 0.66 0.61 |
| 5000 | 0.01 0.01 |
| 6300 | 0.00 0.00 |
| 8000 | 0.07 0.04 |
| 10000 | 0.82 0.52 | critical seal frequency: zero TL

Seal density (kg/m^3) 460 wall separation (mm) 15 seal thickness (mm) 2 calculate critical f = 721.19 Hz zero 1.863E-06 two-wall, single seal system shown

*Optimization Section:*

| | driver | rear pass. |
|---|---|---|
| minimize: | | |
| maximum delta dB | | |
| delta dB at: Hz | | |
| delta dB area | | | additional dB due to seals

| | maximum | | area: |
|---|---|---|---|
| DRIVER | 5.42 dB | | 3.49 |
| REAR PASS. | 5.46 dB | | 2.92 |

------ driver  ——— Rear pass.

FIG. 10b

METHOD AND SYSTEM FOR PREDICTING SOUND PRESSURE LEVELS WITHIN A VEHICLE DUE TO WIND NOISE

TECHNICAL FIELD

This invention relates to methods and systems for predicting sound pressure levels within a vehicle and, in particular, to a method and system for predicting sound pressure levels within a vehicle due to wind noise.

BACKGROUND ART

Automobile noise has gained interest recently with rising consumer expectations. In the past, engines, transmissions, and tires were of the most concern to researchers, but as these became quieter, and with the advent of electric vehicles, aerodynamic noise became more significant.

A vehicle's side window can be one of its most important sound sources. This happens because the A-pillar vortex makes the glass vibrate and radiate sound into the interior.

The article by J. R. Callister and A. R. George entitled "The Transmittion of Aerodynamically-Generated Noise Through Panels in Automobiles", Second International Congress on Recent Developments in Air- and Structure-Borne Sound and Vibration, March 1992, Auburn University, discloses a simplified model of an automobile side window which was subjected to wind tunnel tests. The transmitted noise level was predicted with a Statistical Energy Analysis (SEA) model, which used a single empirical expression for the fluctuating pressure on the automobile side window. The analytical prediction method predicted the frequency distribution of transmitted noise.

The U.S. Pat. No. 4,553,354, to Barbero, recognizes the noise created by automobile window vibration.

The U.S. Pat. No. 4,571,886, to Shiraishi, also discloses automobile window vibration and its attendant noise.

The U.S. Pat. No. 3,904,456, to Schwartz, reduces noise by an air space and a plastic film. The experiment established that sound reduction was related to calculations based on Berger's Law.

The U.S. Pat. No. 3,875,706, to Okawa, discloses that the transmission of sound through a window is effected by the glass supporting material and the thickness and spacing of the glass sheets.

The U.S. Pat. No. 5,097,512, to Batey, discloses the concept of simulating an acoustic test condition by actuating a plurality of transducers printed on detector film which is located adjacent a test block. The output of the detector film is inputted to test equipment via a PCB, thereby avoiding testing the block in water.

SUMMARY OF THE INVENTION

An object of the present invention is to provide a method and system for predicting sound pressure levels within a vehicle due to wind noise to thereby reduce the number of wind tunnel tests needed for wind noise estimations.

Another object of the present invention is to provide a method and system for predicting sound pressure levels within a vehicle due to wind noise to enable designers to assess the impact of vehicle changes on interior sound levels.

Yet another object of the present invention is to provide a method and system for predicting sound pressure levels within a vehicle due to wind noise by accounting for sound radiated from both vibrating side glass and door seals of the vehicle.

Still another object of the present invention is to provide a method and system for predicting sound pressure levels within a vehicle due to wind noise by using only steady-state parameters.

In carrying out the above objects and other objects of the present invention, a method is provided for predicting sound pressure levels (SPLs) within a vehicle due to wind noise. The method utilizes a programmable digital computer system. The method includes the steps of storing in a memory of the computer system a first set of data representing geometry of at least one part of the vehicle capable of vibrating by the wind and vehicle speed. The method also includes the step of storing in the memory a second set of data representing three distinct pressure spectra for vortex, reattached and turbulent boundary layer flows. The method finally includes the steps of computing a third set of data representing SPLs within the vehicle due to sound radiated by the at least one part into the vehicle based on the first and second sets of data, and converting the third set of data into a first set of visual indicia representing the SPLs.

Further in carrying out the above objects and other objects of the present invention, a system is provided for carrying out each of the above-noted method steps.

Preferably, the method and system of the present invention is incorporated into an Excel spreadsheet that runs on a PC wherein it automatically computes plots and tabulates both linear and A-weighted SPL and compares it to user supplied experimental data. Those skilled in the art will recognize that this system could also be implemented on different computer systems (e.g., workstations) using different graphical/computational packages and/or different graphical user interfaces.

The method and system of the present invention can quickly evaluate the effects of vehicle changes (both car and truck) on the resulting noise level. When coupled with reliable CFD (computational fluid dynamics) computations, it can be used very early-on in the design process to help minimize the level of wind noise. This greatly reduces the number of wind tunnel tests needed for wind noise estimations.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

FIG. 10b illustrates a main screen of the PC of FIG. 8a programmed with a seal modeller program;

BEST MODE FOR CARRYING OUT THE INVENTION

Sound Radiation

Sound pressure level (SPL) is usually defined as follows:

$$SPL = 10\log \frac{<p^2>}{P_{ref}^2}$$

where $P_{ref}=20$ μPa is the reference pressure. The mean-square pressure fluctuations can be related to the average sound power radiated by the structure using:

$$<p_0^2> = \frac{\rho c \Pi}{A_p}, \quad (1)$$

where

Π—the average sound power radiated by the structure
ρ—the density of air
c—the speed of sound in air
$A_p$—the area of the vibrating structure.

The average sound power is given by:

$$\Pi = \sigma \rho c A_p <v^2> \quad (2)$$

where σ is the average radiation efficiency and $<v^2>$ is the mean-square velocity of the plate.

Radiation efficiency differs with plate vibration modes, and depends on the way the plate is supported. SEA (i.e., statistical energy analysis) predicts that support is only important near the fundamental frequency $f_{11}$ (i.e., $f_{11}=(L_1/L_2+L_2/L_1)C^2/4A_pf_c$. For a "typical" side glass this frequency is around 80 Hz). Experiments show that sound power varies little between simply supported and clamped plates. An empirical expression for the average radiation efficiency of a simply supported plate is:

$$\sigma = \begin{cases} \frac{Pc}{\pi^2 A_p f_c} \sqrt{\frac{f}{f_c}} & \text{for } f < \frac{f_c}{4} \\ \frac{P\lambda_c}{A_p} g(\alpha) & \text{for } \frac{f_c}{4} < f < f_c \\ 1 & \text{for } f > f_c \end{cases}$$

where P is the perimeter of the plate, $f_c$ is the acoustical coincidence frequency, and $$\alpha = \sqrt{\frac{f}{f_c}} \quad \lambda_c = \frac{c}{f_c}$$

$$g(\alpha) = \frac{1}{4\pi} \left[ \frac{(1-\alpha^2)\ln\left(\frac{1+\alpha}{1-\alpha}\right) + 2\alpha}{(1-\alpha^2)^{1.5}} \right]$$

Equation 1 gives us the SPL near the glass surface. Noting that $\pi/A_p = I_0$ is the average intensity of sound waves near the surface of the plate, one can express the means square pressure fluctuations at the driver's ear position as, $$<p^2>_{ear} = \rho c I, \quad (3)$$

where I is the average intensity of sound waves are the ear position.

Figure 1:
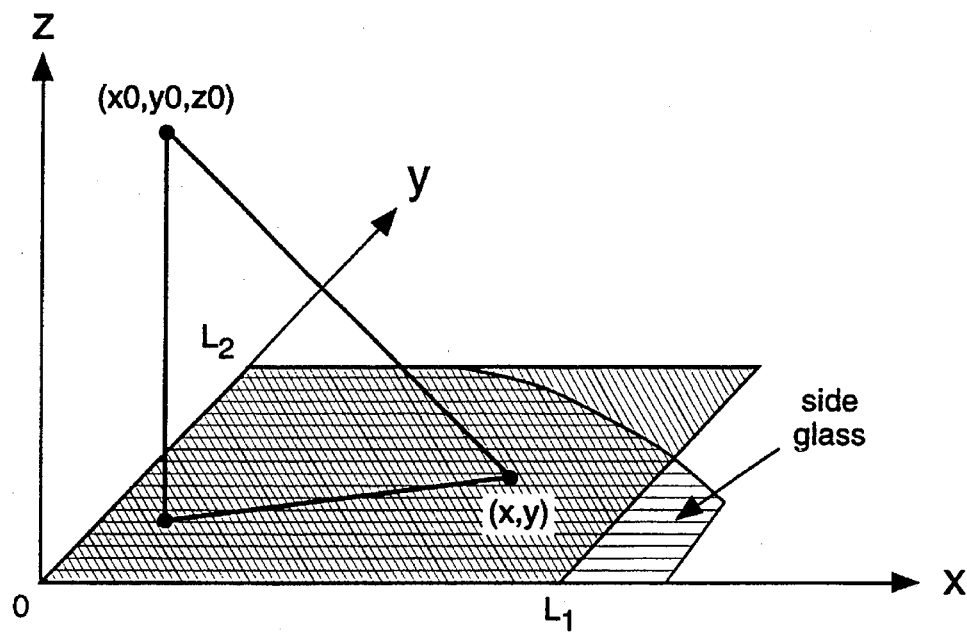
FIG. 1 is a graph illustrating radiation of sound showing the side glass along with the rectangular phase representing it.

If one assumes that $I_0$ is uniform on the plate and that it radiates hemispherically, one can express the value of I at some point $(x_0, y_0, z_0)$ as illustrated in FIG. 1, as:

$$\zeta = \frac{I}{I_0} = \frac{1}{2\pi} \int \int_{A_p} \frac{z_0 \, dx \, dy}{((x-x_0)^2 + (y-y_0)^2 + z_0^2)^{3/2}} \quad (4)$$

where the double integral, evaluated over the surface of the plate, can be done numerically and, in some cases, analytically. ζ is the attenuation factor that accounts for the ear position relative to the plate.

If one chooses $x_0=0$ and $y_0=L_2/2$, which is a reasonable choice of driver's ear position (i.e., the driver's ear is along the B-pillar and halfway up the glass), one obtains:

$$\zeta = \frac{1}{\pi} \arctan\left( \frac{L_1 L_2}{z_0 \sqrt{4z_0^2 + 4L_1^2 + L_2^2}} \right), \quad (5)$$

where $L_1$ and $L_2$ are the length and the width (or height) of the plate, respectively (i.e. the width $L_2$ is equal to the height of the glass. The length $L_1$ is set to what it needs to be so that the area of the resulting rectangular plate equals the area of the side glass), and the plate area $A_p = L_1 * L_2$. $z_0$ is the average normal distance from the ear to the glass surface. Combining Equations 2, 3 and 4, one finally obtains:

$$<p^2>_{ear} = \sigma \rho^2 c^2 <v^2> \zeta.1$$

Side Window Vibration

As indicated in FIG. 1, the car's side window is represented by a rectangular flat plate. SEA reveals that the bending modes corresponding to acoustic frequencies are largely independent of plate shape; only the first few modes are sensitive. Fortunately, since it's hard to set boundary conditions for a vibrating side window precisely, the first few modes are usually predicted wrong anyway.

Consider a simply supported plate characterized by its length $L_1$ and width $L_2$, a uniform mass per unit area $m_s$, and flexural rigidity $D=Eh^3/12(1-\gamma^2)$, where E is the Young's modulus of the glass, h the plate thickness, and $\gamma$ the Poisson coefficient. The displacement $w(x,y,t)$ represents the plate response when it is excited by a normal pressure field $p(x,y,t)$ and subjected to a uniform damping force per unit mass $\zeta\, dw/dt$. The governing dynamic equation is:

$$\frac{\partial^2 w}{\partial t^2} + \zeta \frac{\partial w}{\partial t} + \frac{D}{m_s} \nabla^4 w = -\frac{1}{m_s} p. \tag{6}$$

For the undamped free vibration of such a structure there exists a set of normal modes $f_{mn}(x,y)$ and eigenvalues $\omega_{mn}$ that satisfy the simply-supported boundary conditions and the equation:

$$\frac{D}{m_s} \nabla^4 f_{mn} - \omega_{mn}^2 f_{mn} = 0. \tag{7}$$

A normalization for the orthogonal functions $f_{mn}(x,y)$ is chosen as follows:

$$\int\int_{A_p} f_{mn}(x,y) f_{jk}(x,y) dx dy = L_1 L_2 \delta_{mj} \delta_{nk} = A_p \delta_{mj} \delta_{nk}$$

where $\delta$ is the Kronecker $\delta$-function. The solution to Equation 7 yields:

$$f_{mn}(x,y) = 2 \sin \frac{\pi m x}{L_1} \sin \frac{\pi n y}{L_2} \tag{8}$$

$$\omega_{mn} = \sqrt{\frac{D}{m_s}} K_{mn}^2, \tag{9}$$

where $$K_{mn}^2 = k_m^2 + k_n^2 = \left(\frac{\pi m}{L_1}\right)^2 + \left(\frac{\pi n}{L_2}\right)^2.$$

Since $p(x,y,t)$ is considered to be a random process, it is better to solve the problem in the frequency domain. The Fourier transforms of $p(x,y,t)$ and $w(x,y,t)$ are defined as follows:

$$\hat{p}(x,y,\omega) = \frac{1}{2\pi} \int_{-\infty}^{\infty} p(x,y,t) e^{-i\omega t} dt \text{ and } p(x,y,t) = \tag{10}$$

$$\int_{-\infty}^{\infty} \hat{p}(x,y,\omega) e^{i\omega t} d\omega$$

$$\hat{w}(x,y,\omega) = \frac{1}{2\pi} \int_{-\infty}^{\infty} w(x,y,t) e^{-i\omega t} dt \text{ and } w(x,y,t) = \tag{11}$$

$$\int_{-\infty}^{\infty} \hat{p}(x,y,\omega) e^{i\omega t} d\omega$$

Substituting Equations 10 and 11 into Equation 6 gives:

$$\left(-\omega^2 + i\eta\omega_{mn}\omega + \frac{D}{m_s}\nabla^4\right)\hat{w} = -\frac{1}{m_s}\hat{p}, \tag{12}$$

where $\zeta = \eta\omega_{mn}$, and $\eta$ is the loss factor.

For the situation of small damping and negligible modal coupling, one can express the solution $\hat{w}(x,y,\omega)$ as an infinite sum of normal modes given by Equation 8. That is, $$\hat{w}(x,y,\omega) = \sum_{m,n=1}^{\infty} a_{mn}(\omega) f_{mn}(x,y). \tag{13}$$

When one substitutes the above decomposition into Equation 12, the orthogonality of normal modes yields:

$$a_{mn}(\omega) = \frac{1}{m_s A_p} \frac{1}{(\omega^2 - \omega_{mn}^2) - i\eta\omega_{mn}\omega} \int\int_{A_p} \hat{p}(x,y,\omega) f_{mn}(x,y) dx dy \tag{14}$$

Combining Equations 13 and 14 gives:

$$\hat{w}(x,y,\omega) = \frac{1}{m_s A_p} \sum_{m,n=1}^{\infty} \frac{f_{mn}(x,y)}{(\omega^2 - \omega_{mn}^2) - i\eta\omega_{mn}\omega} \int\int_{A_p} \hat{p}(x,y,\omega) f_{mn}(x,y) dx dy.$$

If modal coupling is negligible and the wall pressure field is homogeneous and isotropic in space, the displacement response spectral density $S_w$ can be expressed in terms of the wavenumber—frequency spectrum $\Phi_{pp}(k_1, k_2, \omega)$:

$$S_w(x,y,\omega) = \frac{1}{m_s^2 A_p^2} \sum_{m,n=1}^{\infty} \frac{f_{mn}^2(x,y)}{(\omega^2 - \omega_{mn}^2)^2 + \eta^2 \omega_{mn}^2 \omega^2} \times \tag{15}$$

$$\int_{-\infty}^{\infty}\int_{-\infty}^{\infty} |\psi_{mn}(k_1,k_2)|^2 \Phi_{pp}(k_1,k_2,\omega) dk_1 dk_2,$$

where $$\psi_{mn}(k_1,k_2) = \int_{A_p}\int f_{mn}(x,y) e^{i(k_1 x + k_2 y)} dx dy$$

is a two-dimensional spatial transform of the normal mode. If one uses the fact that $$\langle v^2 \rangle = \int_{-\infty}^{\infty} \langle S_w \rangle \omega^2 d\omega$$

$$\left( \text{i.e., } \langle g \rangle \equiv \frac{2}{A_p} \int \int_{A_p} g \, dx dy. \right)$$

and that $\langle f_{mn}^2 \rangle = 1$, one can obtain (using Equation 15) that $$\langle v^2 \rangle = \sum_{m,n=1}^{\infty} \langle v_{mn}^2 \rangle,$$

where $$\langle v_{mn}^2 \rangle = \frac{1}{m_s^2} \int_{-\infty}^{\infty} \frac{\omega^2}{(\omega^2 - \omega_{mn}^2)^2 + \eta^2 \omega_{mn}^2 \omega^2} \times \quad (16)$$

$$\frac{1}{A_p^2} \int_{-\infty}^{\infty} \int_{-\infty}^{\infty} |\psi_{mn}(k_1,k_2)|^2 \phi_{pp}(k_1,k_2,\omega) dk_1 dk_2 d\omega.$$

In principle, given $\Phi_{pp}(k_1,k_2\omega)$, one could compute all integrals in Equation 16 exactly. Moreover, in the case of a simply supported plate and the Corcos model for $\Phi_{pp}(k_1, k_2\omega)$, one could do it analytically. However, due to the high density of normal modes in the domain of acoustical frequencies, one can approximate these integrals, with the error being significant only for frequencies lower than $f_{11}$.

The modal response function $\psi_{mn}(k_1,k_2)$ for a simply supported plate is:

$$\psi_{mn}(k_1,k_2) = 8A_p \frac{\genfrac{}{}{0pt}{}{\sin}{\cos}(1/2 \, k_1 L_1)}{(\pi m)\left(1 - \left(\frac{k_1 L_1}{\pi m}\right)^2\right)} \frac{\genfrac{}{}{0pt}{}{\sin}{\cos}(1/2 \, k_2 L_2)}{(\pi n)\left(1 - \left(\frac{k_2 L_2}{\pi n}\right)^2\right)}$$

where the sine function is to be used if m or n is even, and the cosine if m or n is odd. Also, $$\int_{-\infty}^{\infty} \int_{-\infty}^{\infty} |\psi_{mn}(k_1,k_2)|^2 dk_1 dk_2 = 4\pi^2 A_p.$$

If one recognizes that the most of this integral comes from the major lobes around $$k_m = \frac{\pi m}{L_1} \text{ and } k_n = \frac{\pi n}{L_2},$$

one can approximate the modal response function in the following way:

$$|\psi_{mn}(k_1,k_2)|^2 = \pi^2 A_p \, [\delta(k_1-k_m)+\delta(k_1+k_m)][\delta(k_2-k_n)+\delta(k_2+k_n)], \quad (17)$$

where $\delta$ is the Dirac $\delta$-function. Using approximation given by Equation 17 one can evaluate the double integral in Equation 16, $$\frac{1}{A_p^2} \int \int_{-\infty}^{\infty} |\psi_{mn}|^2 \phi_{pp} d\vec{k} = \quad (18)$$

$$\frac{\pi^2}{A_p} [\phi_{pp}(k_m,k_n,\omega_{mn}) + \phi_{pp}(k_m,-k_n,\omega_{mn}) +$$

$$\phi_{pp}(-k_m, k_n,\omega_{mn}) + \phi_{pp}(-k_m,-k_n,\omega_{mn})]$$

Further, since $$\int_{-\infty}^{\infty} \frac{\omega^2 d\omega}{(\omega^2 - \omega_{mn}^2)^2 + \eta^2 \omega_{mn}^2 \omega^2} = \frac{\pi}{\omega_{mn}\eta},$$

and the glass loss factor $\eta$ is small, one can take the following approximation:

$$\frac{\omega^2}{(\omega^2 - \omega_{mn}^2)^2 + \eta^2 \omega_{mn}^2 \omega^2} = \frac{\pi}{\omega_{mn}\eta} \delta(\omega - \omega_{mn}), \quad (19)$$

where $\delta(\xi)$ is as before. Substituting Equations 18 and 19 into Equation 16 yields:

$$\langle v_{mn}^2 \rangle = \frac{\pi^2}{m_s^2 \eta \omega_{mn} A_p} [\phi_{pp}(k_m,k_n,\omega_{mn}) + \phi_{pp}(k_m,k_n,\omega_{mn}) + \quad (20)$$

$$\phi_{pp}(-k_m,k_n,\omega_{mn}) + \phi_{pp}(-k_m,-k_n,\omega_{mn})]$$

The total response of a panel of many modes is usually done in the context of a frequency band $\Delta\omega$ in which there are multiple resonant modes. SEA predicts that provided that the continuum conditions $$\Delta\omega \gg \frac{\pi\eta\omega_{mn}}{2} \text{ and } n(\omega_{mn})\Delta\omega > 1$$

are satisfied, the average mean-square velocity in the frequency band $\Delta\omega$ is $$\langle v^2(\omega,\Delta\omega) \rangle = \sum_{\text{all modes in } \Delta\omega} \langle v_{mn}^2 \rangle = \langle v_{mn}^2 \rangle n(\omega) \Delta\omega. \quad (21)$$

where $n(\omega)$ is the modal density. The modal density of a uniform plate is:

$$n(\omega) = \frac{A_p}{4\pi K C_1}, \quad (22)$$

$$K = \sqrt{\frac{h^2}{12}} \text{ is the radius of gyration}$$

where $$C_1 = \sqrt{\frac{D}{m_s K^2}} \text{ is the longitudinal wave speed in the plate.}$$

For a typical side glass, both continuum conditions are satisfied past 160 Hz. This, and the observations regarding the fundamental frequency $f_{11}$, lead one to conclude that the SEA approach should be valid at least for frequencies greater than 160 Hz.

By substituting Equations 20 and 22 into Equation 21, one finally obtains:

$$\langle v^2(\omega_f,\Delta\omega_f) \rangle = \quad (23)$$

$$\frac{\pi^2}{4 m_s^2 \eta K C_1} \frac{\Delta\omega_f}{\omega_f} [\phi_{pp}(k_m,k_n,\omega_f) + \phi_{pp}(k_m,-k_n,\omega_f) +$$

$$\phi_{pp}(-k_m,k_n,\omega_f) + \phi_{pp}(-k_m,-k_n,\omega_f)],$$

where the subscript f denotes a frequency band centered around a frequency f. One can simplify the above expression if a particular form of $\Phi_{pp}(k_1, k_2, \omega)$ is considered.

Wavenumber-Frequency Spectra Of The Fluctuating Wall Pressure

The problem of finding a wavenumber-frequency spectrum for fluctuating wall pressure is difficult to solve since neither theoretical nor experimental studies have provided an accurate model of wall pressure fluctuations so far. Many empirical models were developed in recent years, but they are valid only for a narrow class of stationary, fully-developed, turbulent boundary-layer flows. No robust model that could predict the fluctuating properties of unstationary flows has been reported yet.

The major problem in modelling wall pressure fluctuations is scaling. Even for stationary turbulent boundary layers, one knows there isn't a single set of similarity variables covering the whole range of frequencies. Therefore, the prior art does not disclose similarity variables that could scale unstationary flows.

Generally, there are three regions in the frequency spectrum of fluctuating wall pressure. The first (low frequency power input region) is defined by the external flow, and it can be scaled on outer variables. Here, the largest eddies are born by the shear stress. In the second (medium frequency inertia region) these eddies interact producing ones of smaller scales. This region is usually scaled on combined inner-outer variables. The last (high frequency dissipation region) is determined by the viscous interaction, so it can be scaled on inner variables. In this last region, spectral properties of all flows are independent of the external conditions, so they can be scaled fairly easy. Experiments have shown that in the power input and inertia regions, the local turbulence Reynolds stress $-\overline{\rho u\,v}$ may be a good scale of pressure fluctuations, but the turbulence stress itself should be scaled, so this seems to be of limited value for engineering applications.

The above discussion shows that there are many options in the choice of scaling variables. Numerous experiments showed that the majority of the radiated sound power comes from the first two frequency regions, with the power coming from the dissipation region being negligible. The prior art shows that local variables should be used in scaling, so outer local variables are used herein to scale fluctuating wall pressure. The Corcos model, which satisfactorily describes the cross-spectral densities of pressure fluctuations for both equilibrium and non-equilibrium flows, is described in "The Structure of the Turbulent Pressure Field in Boundary-Layer Flows", G. M. Corcos, *JOURNAL OF FLUID MECHANICS* 18, 353–378 (1964).

Because three different types of flow may exist on a vehicle side window, three different models are used. The first, and most significant, is vortex flow.

Vortex Flow

Since experiments have not shown any convection transport processes (though a slight convection may exist in the direction of the vortex axis), the Corcos model in the following form can be considered:

$$\phi_{pp}(k_1, k_2, \omega) = \frac{\phi_{pp}(\omega)}{\pi^2} \left\{ \frac{\alpha \frac{\omega}{U_m}}{k_1^2 + \left(\alpha \frac{\omega}{U_m}\right)^2} \right\} \left\{ \frac{\beta \frac{\omega}{U_m}}{k_2^2 + \left(\beta \frac{\omega}{U_m}\right)^2} \right\} \quad (24)$$

where $\alpha$ and $\beta$ are the empirical coefficients, $$U_m = U_\infty \sqrt{1 - C_p}$$

is the local flow speed, and $\Phi_{pp}(\omega)$ is the spectral density of the wall pressure. The values of $k_{1,2}$ should correspond to a bending mode, so according to Equation 9:

$$k_{1,2} \propto \left(\frac{m_s}{D} \omega^2\right)^{1/4} .$$

To find values of $\alpha$ and $\beta$, one must know streamwise and transverse coherence spectra of fluctuating wall pressure. However, no measurements of these spectra in unstationary flows was found. The only conclusion one could draw from the prior art is that $\alpha \approx 6\beta$. Nevertheless, since intensive mixing inside the vortex core significantly decreases correlation lengths, one may assume that both $\alpha \ll 1$ and $\beta \ll 1$. This means that there exists a range of velocities where one can neglect $k_1$ and $k_2$ compared to $\omega/U_m$. The lower limit of this range is obviously zero, while the upper limit $U^*(\omega)$ depends on frequency and can be derived from $$\left(\frac{m_s}{d} \omega^2\right)^{1/4} \approx \frac{\omega}{U^*(\omega)} ,$$

from which $$U^*(\omega) \approx \left(\frac{D}{m_s} \omega^2\right)^{1/4} .$$

For 4 mm thick glass and f=100 Hz, the above relation gives $U^* \approx 150$ mph. Therefore, depending on the lowest frequency one wants to look at and provided that $U_m < U^*$, one may use a simplified version of Equation 24, $$\phi_{pp}(k_1, k_2, \omega) = \phi_{pp}(\omega) B \frac{U_m^2}{\omega^2} , \quad (25)$$

where only the empirical constant $$B = \frac{1}{\pi^2 \alpha \beta}$$

is left.

Figure 2A:
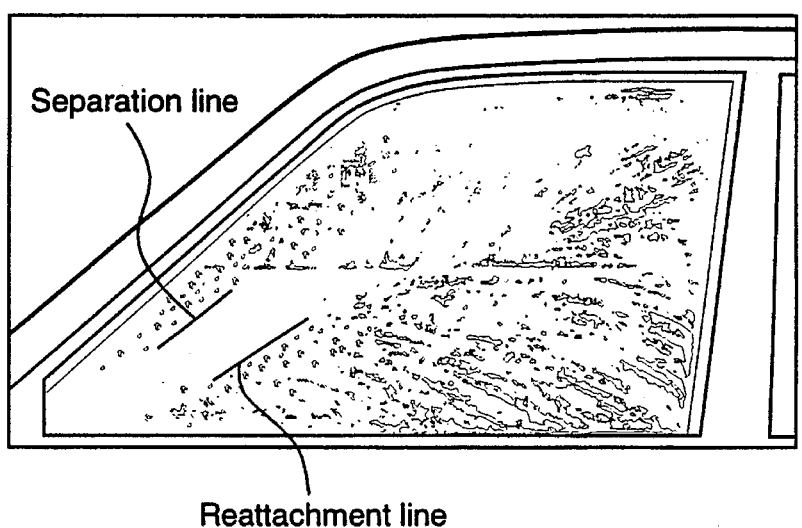
FIG. 2a is a diagram illustrating a typical flow pattern on a front side window of a vehicle.
Figure 2B:
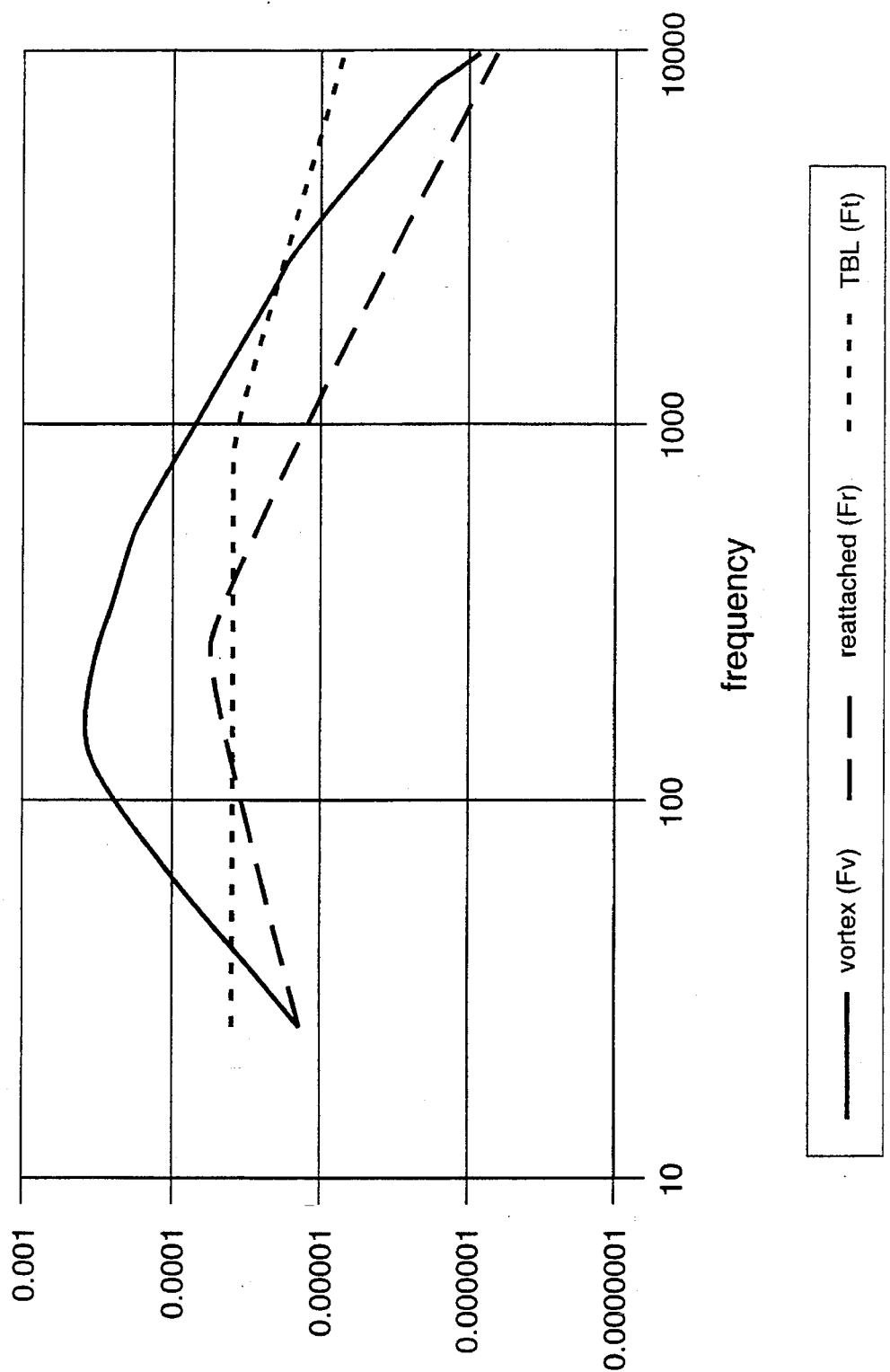
FIG. 2b are graphs of the functions $F_v$, $F_r$ and $F_t$ for a sample vehicle speed and shape.

As mentioned above, one should scale the spectral density $\Phi_{pp}(\omega)$ on outer local variables, i.e.

$$\phi_{pp}(\omega) = \frac{q_m^2}{f_{scl}} F_v\left(\frac{f}{f_{scl}}\right) ,$$

where $q_m = \frac{1}{2}\rho U_m^2$ is the dynamic head based on the local velocity of the flow and $f_{scl}$ is some scaling frequency (see FIG. 2b for $F_v$). A physical process causing pressure fluctuations determines this frequency. Usually, it is written as:

$$f_{scl} = \frac{U_\infty}{L} ,$$

where L is some length scale, e.g., the length of the separated flow region or the size of the vortex core, which are known to be generally constant. However, for the present problem, this choice of the length scale has several disadvantages. First, the free stream velocity $U_{00}$ is a good scale for global quantities, such as drag, but since $C_p$ is not equal to zero on the surface of the window, it is better to use the local flow speed for scaling. Second, it is difficult to measure both the separation length and the vortex size on the outside of the side window since the A-pillar vortex is unstationary, so these quantities may be determined only on average.

Finally, the above scaling describes the process of transmission of energy from large-scale eddies to fine-scale eddies but it does not describe how this energy was received by large eddies, i.e., power input is not scaled. One knows that the spectral density of fluctuating wall pressure leaks in the frequency range corresponding to large scale power input. Hence, one must look at large scale structures in the flow and vortex formation.

A prior art study of delta-wing vortex formation showed that the natural shedding frequency was proportional to the square root of the flow velocity. Thus, the present scaling frequency was set proportional to the square root of the local flow speed. If the vortices are shed at a constant Strouhal number, this would imply that the length scale also increases as the square root of velocity. That is, $$L(U_m) = C\sqrt{U_m}.$$

Therefore, a reasonable choice of the scaling frequency would be:

$$f_{scl} = \frac{U_m}{C\sqrt{U_m}} = \frac{\sqrt{U_m}}{C}.$$

Experimental data obtained on vehicles in a wind tunnel test to find the values of B and C as well as the dimensionless function ($F_v(S_t)$, where $S_t=fL/Um$.

If one supposes that vortex shedding happens at $S_t \approx 0.2$, it gives the value of C. Then, the whole problem was solved backwards, and SPL (sound pressure level) at the driver's ear position was converted to the wavenumber-frequency spectrum of the wall pressure. With an arbitrary value of B, the functional form of $F_v(S_t)$ was obtained. From the data presented by the prior art, one concludes that in the vortex $$\sqrt{<p^2>} \approx 0.0304 \, q_m, \quad (27)$$

which is in a good agreement with the prior art. By noting that $$<p^2> = q_m^2 \times 2 \int_0^\infty F_v(S_t) dS_t,$$

one can scale the function $F_v(S_t)$ using Equation 27. Final matching of experimental and empirical curves gave the value of B (0.04). The value of B was determined under the assumption that the loss factor $\eta=0.01$. If the actual loss factor was different, then the value of B should be appropriately adjusted. A model of the wavenumber-frequency spectrum of fluctuating wall pressure was developed. The value used for the local pressure coefficient $C_p$ was the average value of $C_p$. If the pressure distribution is not known $<C_p> \approx -0.5$, which is a reasonable value for passenger vehicles, may be used at zero yaw angles.

Reattached Flow

This type of flow exists between the point of reattachment of a free-shear layer and a point where it becomes an equilibrium turbulent boundary layer again. As with vortex flows, the problem of scaling arises when one tries to build a model of wall pressure fluctuations in reattached flows. The impingement and splitting of the shear layer at reattachment produces high levels of turbulence activity in the reattached flow, and as this energized flow convects downstream it undergoes a relaxation and redevelopment process. Thus, the reattached flow is a fundamentally inhomogeneous, non-equilibrium flow. No variables suitable for practical applications that could scale this flow have been found so far. The prior art estimates that the reattached flow may extend up to 100 heights of the separation bubble. If one considers a 5 mm separation bubble (as would exist, e.g., in the glass offset region), the reattached flow will extend up to 50 cm. Therefore, even if a large scale separation does not occur (say, flow over the A-pillar does not separate), the reattached flow probably covers a large portion of the side window surface since different gaps, joints, steps etc. create small separation zones.

The Corcos model with convection ($U_c$) to approximate the wavenumber frequency spectrum of the reattached flow is used:

$$\phi_{pp}(k_1,k_2,\omega) = \frac{\phi_{pp}(\omega)}{\pi^2} \left\{ \frac{\alpha \frac{\omega}{U_m}}{\left(k_1 - \frac{\omega}{U_c}\right)^2 + \left(\alpha \frac{\omega}{u_m}\right)^2} \right\} \left\{ \frac{\beta \frac{\omega}{U_m}}{k_2^2 + \left(\beta \frac{\omega}{U_m}\right)^2} \right\},$$

Results of the prior art were used to obtain $\alpha$, $\beta$, $U_c$ and $\Phi_{pp}(\omega)$. Their data was averaged over the flow and the following values were derived:

$\alpha=0.06$, $\beta=0.46$, and $U_c=0.8\,U_m$, where $$U_m = U_\infty \sqrt{1 - C_p}$$

is the local velocity of the flow. Usually in this region $<C_p> \approx -0.2$ at zero yaw angle. A new function $F_r$ for the reattached flow region was determined (see FIG. 2b) to obtain:

$$\phi_{pp}(\omega) = \frac{q_m^2 h_{sb}}{U_m} F_r\left(\frac{\omega h_{sb}}{U_m}\right).$$

For this model $$\sqrt{<p^2>} \approx 0.0107 \, q_m.$$

Parameter $h_{sb}$ is the size of a separation bubble in the direction normal to the window. In general, it coincides with the (normal) size of the A-pillar vortex and is found to be approximately one quarter of the separation length along the window surface normal to the A-pillar. If separation does not occur, rain gutter height and window recess depth define the value of $h_{sb}$.

Turbulent Boundary Layer

If no significant disturbances are present in the flow, an equilibrium turbulent boundary layer (TBL) develops. An extensive study of TBLs has been made in the prior art, so the standard model in the Corcos form is presented, $$\phi_{pp}(k_1,k_2,\omega) = \frac{\phi_{pp}(\omega)}{\pi^2} \left\{ \frac{\alpha \frac{\omega}{U_m}}{\left(k_1 - \frac{\omega}{U_c}\right)^2 + \left(\alpha \frac{\omega}{u_m}\right)^2} \right\} \left\{ \frac{\beta \frac{\omega}{U_m}}{k_2^2 + \left(\beta \frac{\omega}{U_m}\right)^2} \right\},$$

where $\alpha=0.11$, $\beta=0.715$, and $U_c=0.66\,U_m$.

Usually in this region $<C_p>\approx 0$ at zero yaw angle, so $U_m \approx U_{00}$. For a turbulent boundary layer flow, one has a third function $F_t$ (see FIG. 2b):

$$\phi_{pp}(\omega) = \frac{q_m^2 \delta^*}{U_m} F_t\left(\frac{\omega \delta^*}{U_m}\right).$$

For this model $$\sqrt{<p^2>} \approx 0.0098 \, q_m.$$

The parameter $\delta^*$ is known as the displacement thickness. Usually $\delta^* = 0.135 \, \delta$, where $\delta$ is the boundary layer thickness. If it is not known, one can use the following relation:

$$\delta = 0.37 \frac{l}{Re_1^{0.2}}, \text{ where } Re_1 = \frac{\rho U_m l}{\mu},$$

and $l$ is some characteristic length scale, say, the length of the window.

Combined Flow

In the general case, flows of different types may exist on the surface of the side-window at the same time as it is shown in FIG. 2a.

One might consider this flow as a combination of basic flow patterns. One needs to perform a new, more complex analysis of the plate vibration if one wants to combine different flow patterns because the previous analysis assumed the pressure field to be homogeneous and uniform over the whole plate. However, in SEA, this restriction may be neglected and flow regions can be considered separately. In such cases, only the spatial averaging of flexural bending modes will change, i.e., each mode will be averages not over the entire plate surface but only over the area that is covered by a particular type of flow. This leads to the power input from a particular flow regime being proportional to the area of the plate under this flow. Equation 23 is still valid but different wavenumber-frequency spectra enter it with their weights:

$$\varphi_i = \frac{\text{area}_{flow_i}}{\text{area}_{plate}}.$$

Thus, using the symmetry of the wavenumber-frequency spectra obtained above, one can rewrite Equation 23 in the following form:

$$<v^2(\omega_f, \Delta \omega_f)> = \frac{\pi^2 \Delta \omega_f}{m_s^2 \eta K C_l \omega_f} \{ \varphi_v \phi_v + \varphi_r \phi_r + \varphi_t \phi_t \}, \quad (28)$$

$$\phi_v = \phi_{pp}^{vortex}(k_1, k_2, \omega)$$

where $$\phi_r = \frac{1}{2} [\phi_{pp}^{reatt}(k_1, k_2, \omega) + \phi_{pp}^{reatt}(-k_1, k_2, \omega)]$$

$$\phi_t = \frac{1}{2} [\phi_{pp}^{tbl}(k_1, k_2, \omega) + \phi_{pp}^{tbl}(-k_1, k_2, \omega)]$$

and where obviously $$\phi_v + \phi_r + \phi_t = 1.$$

Equation 28 is the final expression since it can model any combination of flows. One needs to define the wavenumbers $k_1$ and $k_2$ before this mode can be used. If one assumes that the flow direction coincides with the x-axis, the previous analysis suggests that these wavenumbers should correspond to the strongest resonant bending wave. Hence, a reasonable choice of $k_1$ and $k_2$ would be:

$$k_1 = \left(\frac{m_s}{D} \omega^2\right)^{1/4} \text{ and } k_2 = 0.$$

Yaw Angle and Side Mirror Effects

One can appreciate scaling fluctuating wall pressure on local parameters since different effects can be taken into account. Zero yaw angle rarely exists since vehicles are constantly exposed to crosswinds. To model this, one must first look at what happens to the external flow past a car. It is known that both separation on the leeward side and vortex intensity increase with increasing angle and local velocity. These effects can be easily incorporated in the model since they enter through the local average pressure coefficient $<C_p>$ and the flow type weight coefficients $\phi_i$. In fact, the model remains the same but new values of $<C_p>$ and $\phi_i$, that one can either measure in experiments or compute using CFD, should be used. If these results are not available, one can use a simple linear default relation.

First of all, its clear that vortex flow is most important for nonzero yaw angles since both the vortex size and intensity increase, while weights of other flow types decrease. Therefore, only this flow will be discussed.

The prior art shows that for small yaw angles, the force acting on the car exposed to side winds varies linearly with the yaw angle. This means that $<C_p>$ varies linearly too. Experimental data exhibited this dependence.

Figure 3:
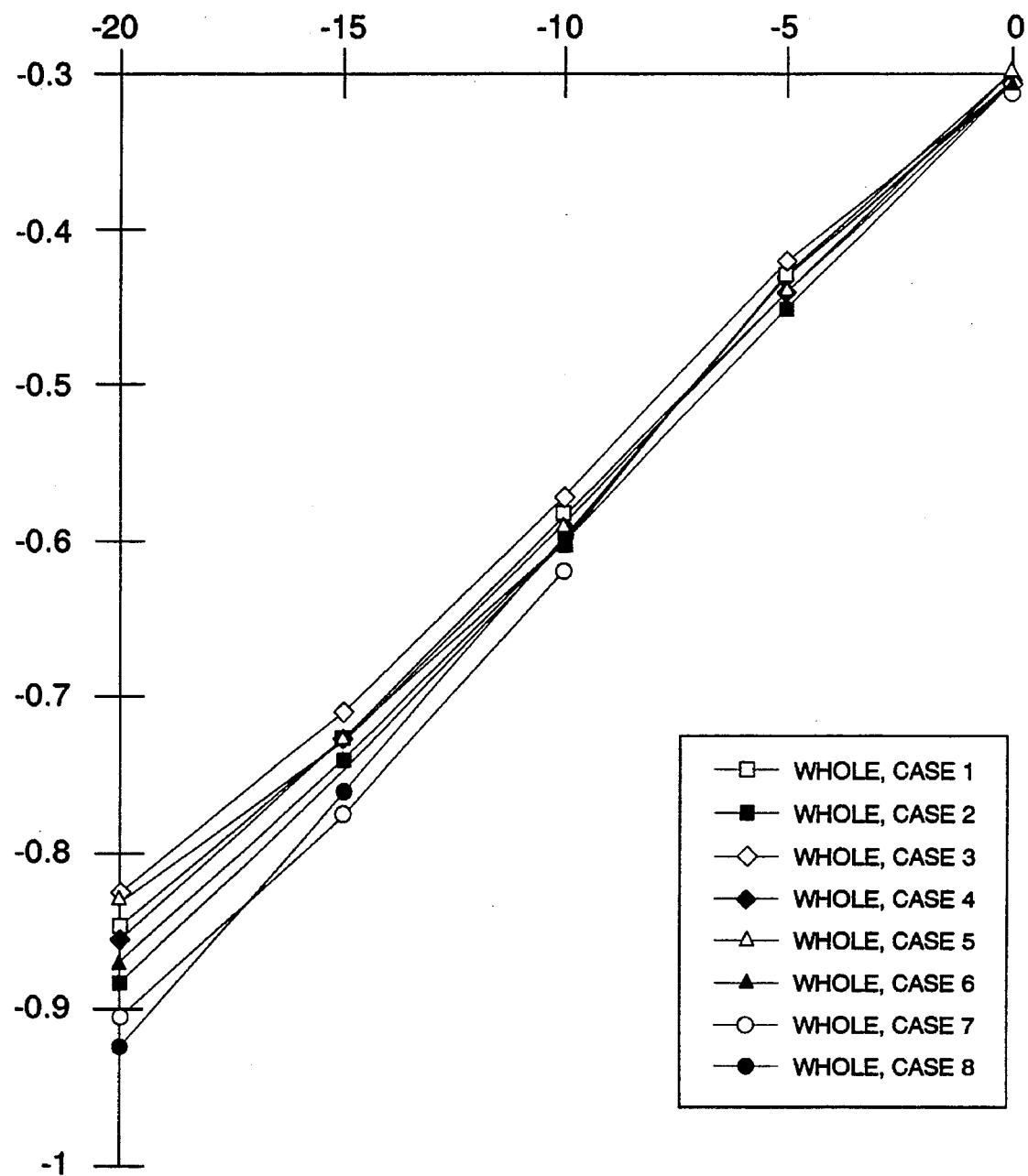
FIG. 3 is a graph of average Cp on the side glass of a vehicle versus yaw angle.

FIG. 3 shows the $C_p$ averaged over the entire side glass of a vehicle at 70 mph as a function of yaw angle. The Table 1 below gives the average pressure coefficient in the vortex region measured on the vehicle.

TABLE 1

| Yaw Angle (degrees) | $<C_p>$ |
| --- | --- |
| 15 | −1.1 |
| 0 | −0.7 |
| −15 | −0.3 |

(The sign of the yaw angles are different in the two cases because the measured windows are different. The convention used herein is for the driver' position and a positive yaw angle means the wind comes from the passenger's side). In addition, the separation length turned out to be proportional to the yaw angle too. The $C_p$ data could both be represented well by:

$$C_p(\gamma) = C_{p0} - 1.58 \gamma \, \phi_v = \phi_{v0} + 0.6 \gamma,$$

where $\gamma$ is the yaw angle (in radians) and $C_{p0}$ and $\phi_{v0}$ correspond to zero yaw angle results. For large angles (>20°) the above linear relations are not valid anymore because the A-pillar vortex detaches from the window surface, and the model cannot be used. The $\phi_v$ relationship given above is only for the A-pillar vortex.

If a side mirror is present, it has its own vortex area which must be added to $\phi_v$. In addition, the pressure spectra under the mirror separation bubble may be different from the spectra under the A-pillar vortex. The side mirror vortex grows in area when the A-pillar vortex shrinks and vice versa with yaw angle. If air comes from the driver's side, say, the A-pillar vortex, there will be suppressed but the mirror vortex will be pushed against the glass thereby increasing its impact. So the total vortex area when a side mirror is present may not change as much with yaw angle as the case without one. This would imply that the change in SPL with yaw angle might be less for a vehicle with a mirror than for one without.

Figure 4A:
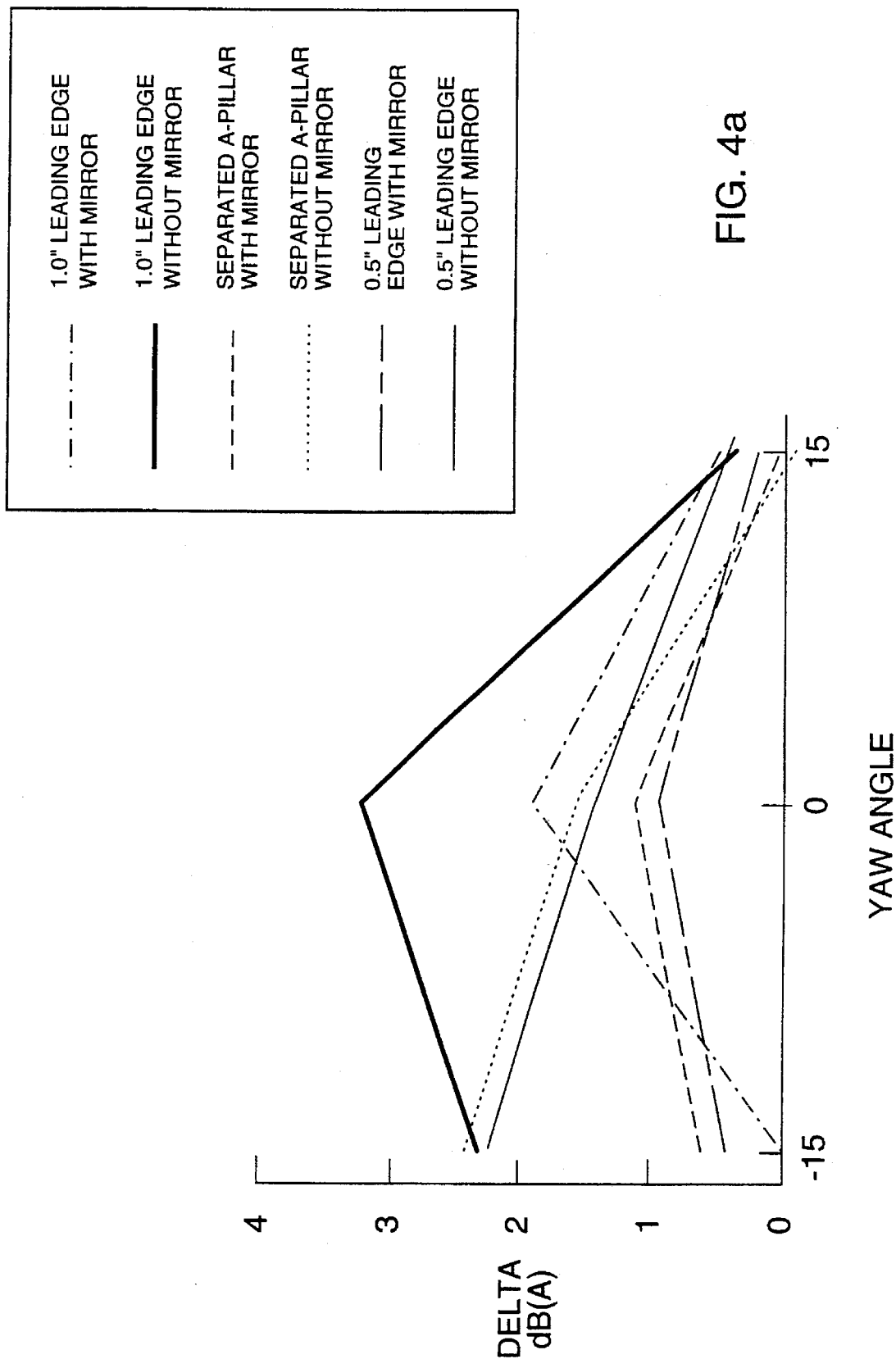
FIGS. 4a and 4b are graphs of delta dB(A) measurements versus yaw without and with a mirror, respectively.
Figure 4B:
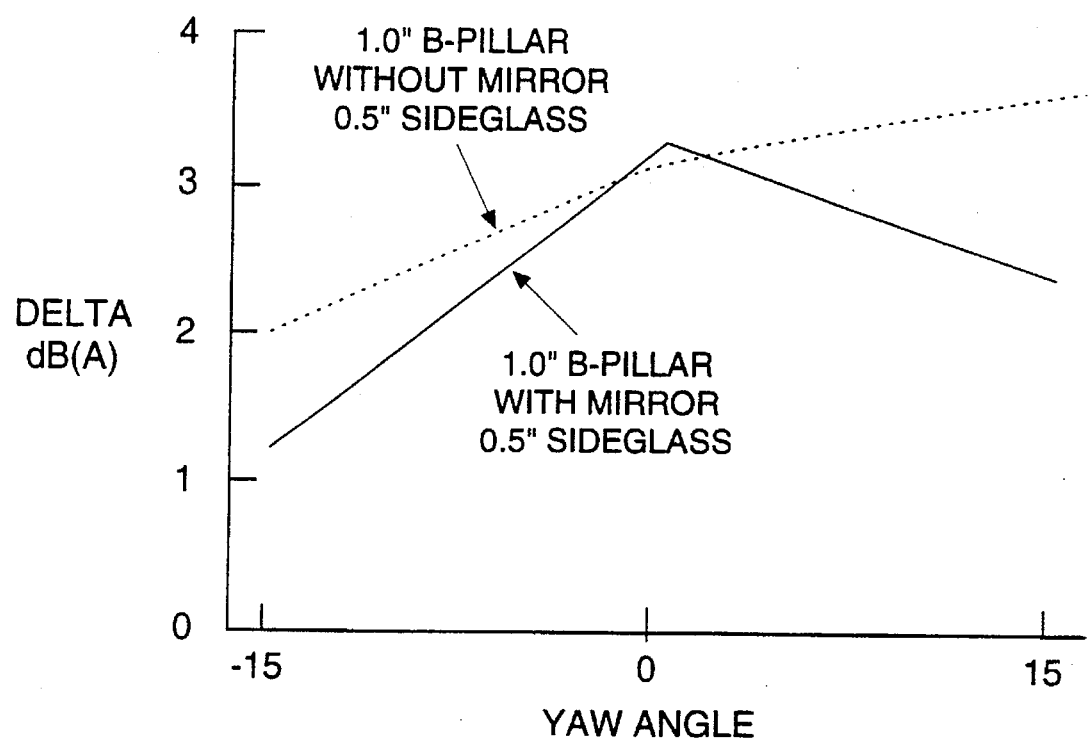

FIGS. 4a and 4b bear this out. They consist of delta dB(A) measurements made on a vehicle. They clearly show that the delta effect with yaw is less with the mirror than without it.

One final conclusion can be drawn from the linear approximations. Since the yaw angle is assumed to be small, the Taylor series can be used in the following chain of proportionalities, $$\sqrt{<p^2>} \propto U_m^{const} \varphi_v^{const}$$
$$\propto (1 - C_p)^{const}(1 + const \times \gamma)^{const}$$
$$\propto (const + const \times \gamma)^{const}(1 + const \times \gamma)$$
$$\propto const + const \times \gamma,$$

where const denotes some constants, which are not important for this estimation. Further, because $$SPL = const \times \log \sqrt{<p^2>} + const$$

one can conclude that $$SPL = const + const \times \delta.$$

This result agrees with experimental data that for small yaw angles total SPL varies linearly with it.

Seal Effects

There are two mechanisms for noise transmission of the seals of a vehicle. The first is when the seals lift off the door or body frame and permit air to escape from the passenger compartment. This is called aspiration and is not so much transmission through a seal as it is past it. It is quite common at high speeds and high yaw angle for a vehicle with only one seal (e.g., the door weatherstrip). It also occurs around poorly designed glass runs, particularly along the upper edge of the window.

The second mechanism occurs when the seal remains in contact with the vehicle surface but vibrates due to pressure fluctuations in the door gaps. Since the fluctuations are aerodynamic in nature, one can use experimental data to help predict at which critical frequencies noise transmission can be expected.

Figure 5:
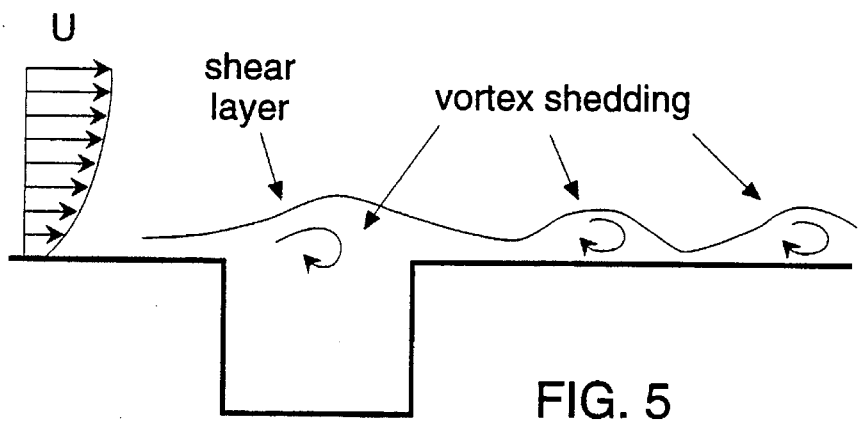
FIG. 5 is a schematic diagram showing flow over a door gap and the resultant vortex shedding and impingement.

The first, and most significant, critical frequency occurs due to flow over the door gap. This is illustrated in FIG. 5.

Numerous experiments on turbulent flows over rectangular channels have revealed the critical shedding frequency $f_n$ as a function of channel geometry, boundary layer thickness and free stream flow speed. This can be summarized by the following formula:

$$f_n = 0.33(n - .25)\frac{U}{L}$$

where L is the length of the channel (related to the door margin), U the local speed ($U_m$ in the notation) and n the number of vortices across the channel. Typically, for small door margins (on the order of 5–8 mm) n=1. One expects that sound will be transmitted through the seals at this frequency. Since the shedding process is unstable, one does not expect that only this frequency will emit sound and so the heuristic assumption was made that noise will be transmitted in the form of a Gaussian distribution centered about this critical frequency. The amplitude and spread of the Gaussian are determined by engineering judgment based on experimental data over a wide range of vehicles.

Figure 6:
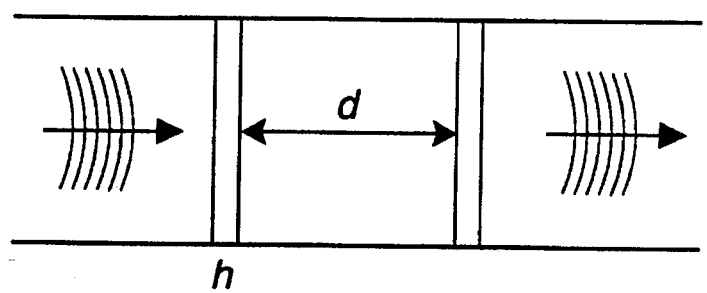
FIG. 6 is a schematic diagram of a seal system.

In addition to the critical shedding frequency, there are those associated with the locations of zero transmission loss (TL) for the seal system. Consider the arrangement of FIG. 6 where h is the seal wall thickness, $\rho$ the seal density, and d the separation distance between the two walls of the seal (this is an idealization of a single "circular" seal; the rest of the seal wall lies along the upper and lower surfaces in FIG. 6). A sound is generated on the left of the channel and one wants to know the nature of the sound that will be emitted on the right. One can show that zero sound transmission loss occurs at the critical frequency $\omega$ that satisfies the nonlinear equation:

$$1 = \left(1 + \frac{\beta^2}{4}\right) + \frac{\beta^4}{16} - \frac{\beta^2}{2}\left(\frac{\beta^2}{4} + 1\right)\cos\left(\frac{2\omega d}{c} - \alpha\right)$$

where $$\sin\alpha = \frac{4\beta}{\beta^2 + 4} \text{ and } \beta = \frac{\omega\rho h}{\rho_0 c}.$$

This equation looks more formidable than it actually is since the equality will be satisfied when the cosine term equals one, or when $$\left(a^2\omega + \frac{4}{\omega}\right)\sin(\omega b) - 4a = 0,$$

where $$a = \frac{\rho h}{\rho_0 c} \text{ and } b = \frac{2d}{c}.$$

There is only one frequency that satisfies the above relationship and it can be determined numerically. It is a function of the seal geometry and material properties. If one further assumes that $\omega b$ is small, the above equation can be approximated by:

$$\left(a^2\omega + \frac{4}{\omega}\right)\left(\omega b - \frac{\omega^3 b^3}{6}\right) - 4a = 0,$$

from which one obtains a biquadratic equation that can be solved exactly, giving:

$$f_{TL} \equiv \frac{\omega}{2\pi} = \frac{1}{2\pi}\sqrt{\frac{-a_2 - \sqrt{a_2^2 - 4a_1 a_3}}{2a_1}},$$

$$a_1 = \frac{a^2 b^3}{6}, a_2 = \left(\frac{2b^3}{3} - a^2 b\right) \text{ and } a_3 = 4(a - b).$$

Now the result just presented is valid for a two-wall seal system, i.e., for a single seal like the door weatherstrip. If there are additional seals, one can still obtain the critical frequencies, albeit by a more involved numerical procedure (there are (n-1) such frequencies for an n-wall system). However, if one assumes that in adding seal walls the separation distance, wall thickness, and material properties remain constant then the frequencies can be determined for the n-wall case with just the 2-wall value. This can be summarized in Table 2:

TABLE 2

| NUMBER OF WALLS | SCALE FACTOR |
|---|---|
| 2 | 1 |
| 3 | .71 and 1.24 |
| 4 | .54, 1 and 1.31 |
| 5 | .44, .83, 1.15 and 1.35 |

Thus, one can obtain the critical frequencies for any number of walls by multiplying $f_{TL}$ given above by the appropriate scale factors. For example, if the critical frequency for a 2-wall system is 800 Hz then a 4-wall system would have critical frequencies at 432 Hz (800*.54), 800 Hz and 1048 Hz (800*1.31).

SPL Contributors

Side Glass vs. Seal Noise Transmission

Figure 7:
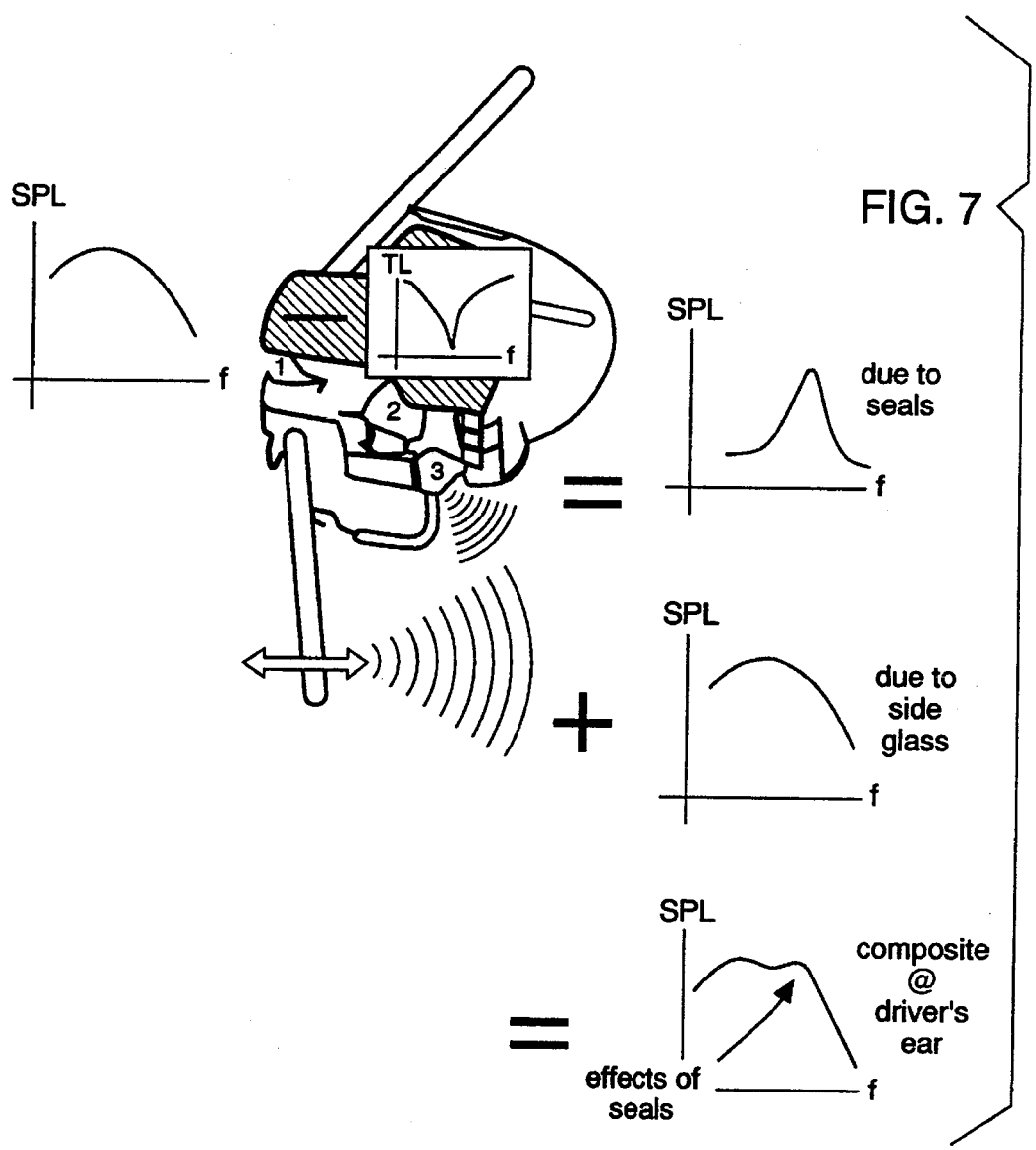
FIG. 7 is a diagram showing the wind noise contributions to the composite SPL at the driver's ear.

The factors contributing to the SPL at the driver's ear are illustrated in FIG. 7 which schematically shows what occurs with nonaspirating seals. Air pressure fluctuations outside the door gaps establish an SPL distribution (shown along with others in A-weighted format). The dB level is higher than that inside the passenger compartment. As this sound passes through the seal system it is attenuated due to the geometry and physical properties of the compressed seal. Only that sound near the critical frequencies of the seals will contribute to the sound that the driver hears. To determine the seal contribution one must take the SPL distribution all along the door gaps (which varies with position) and "subtract" from it the transmission loss characteristics determined from FEA analyses. The difficulty with this approach is that it demands that one know the SPL levels outside the gaps. Measuring these outer SPL levels experimentally is quite difficult and expensive. Computational aeroacoustics cannot predict this either with any accuracy. As a result, while an FEA analysis to predict transmission loss might be used to compare two seal configurations for relative effectiveness, or to design a seal system with a large TL, it cannot be used alone to determine the seal contribution to the composite level heard at the driver's ear. For the sake of discussion, a seal SPL contribution is assumed. There is a need to "add" the seal SPL curve to the vibrating glass SPL to obtain the composite SPL level. This addition process, however, can mask out nonzero seal contributions. To understand this, consider the way two dB values, say $x_1$ and $x_2$, are added to form their sum, x. One must first convert each value to a pressure, add them, and then convert this new pressure back to a dB level. This procedure can be expressed mathematically as $$x = 10 \log_{10}(10^{0.1 x_1} + 10^{0.1 x_2}).$$

For example, assuming $x_1 = 60$ dB and $x_2 = 50$ dB, the above formula would give the sum x=60.41 dB, hardly much of a difference from $x_1$. This situation can occur with triple seal systems (primary, secondary and cutline seals) where although the computed contribution is nonzero it adds practically nothing to that due to the side glass alone.

Under non-aspirating conditions and with adequate seal contact, the side glass and composite SPL levels are often very close to each other, the maximum difference typically on the order of 5 dB in certain frequency bands. But if the seals aspirate, this difference may reach 12–15 dB in some spots. A "rule of thumb" is that if the measured SPL level (in an A-weighted scale) in the 800–1500 Hz range is higher than that at the 200–500 Hz range then the seals are aspirating.

To summarize then: for a seal system that maintains adequate contact, one can say that the major contribution to the SPL level at the driver's ear is due to the vibrating glass surface. Small corrections to this curve can be made to account for noise transmission through the seals.

The Wind Noise Modeller

Figure 8A:
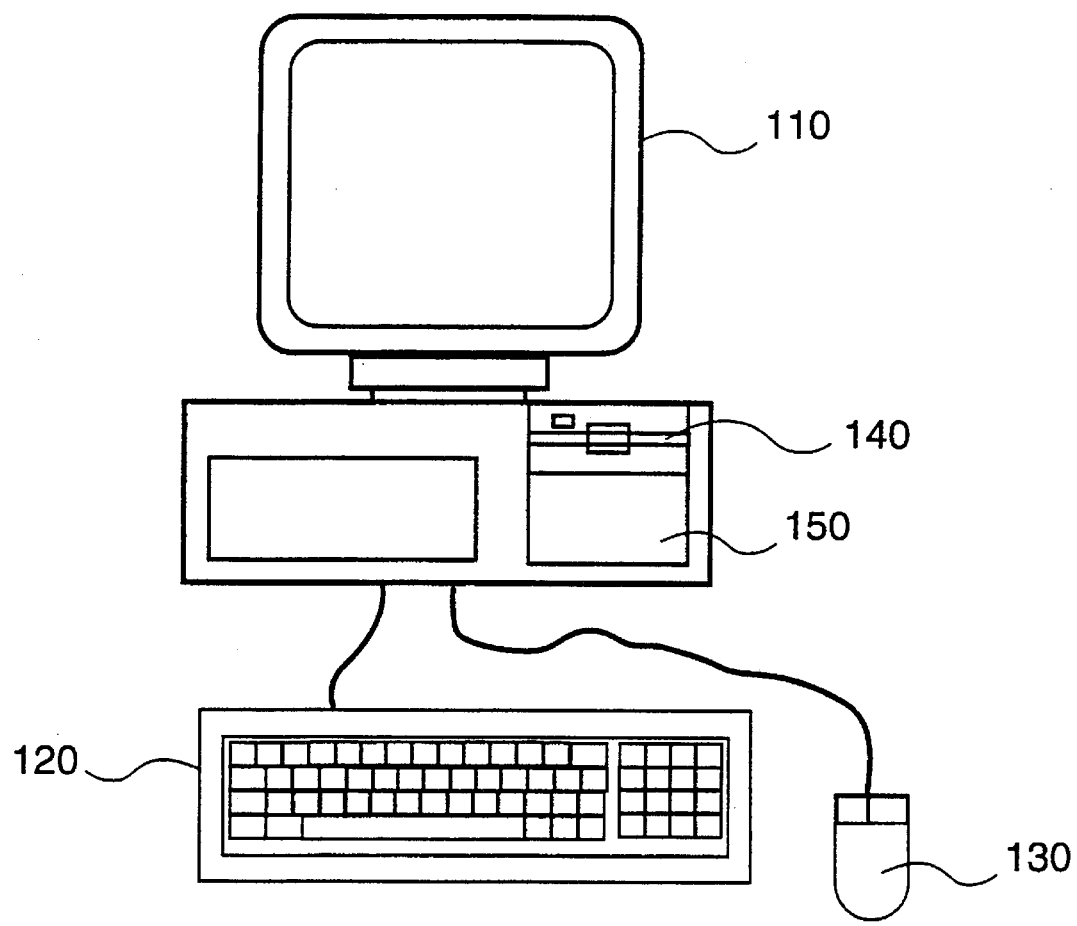
FIG. 8a is a schematic diagram of a PC programmed in accordance with the teachings of the present invention.
Figure 8B:
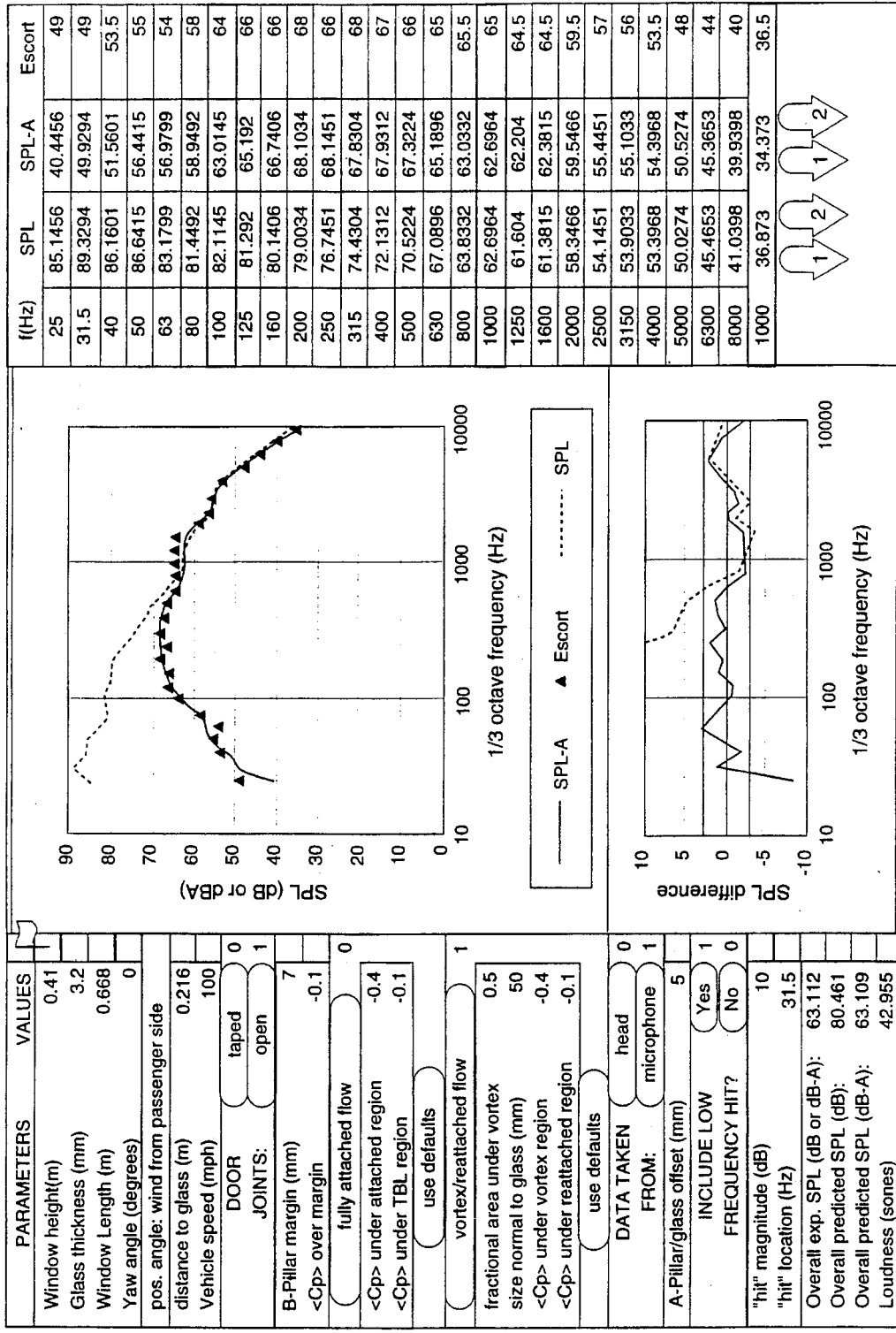
FIG. 8b illustrates a main screen of the programmed PC of FIG. 8a with the wind noise model of the present invention.

The method and system of the present invention preferably includes a wind noise modeller (i.e., WNM) which is implemented as an Excel spreadsheet that runs on a PC as illustrated in FIG. 8a. The main screen of the programmed PC is shown in FIG. 8b. Parameters needed for the computation are listed on the left hand side. They include the side glass geometry, vehicle speed, and characterizations of the flow regimes on the glass including vortex area and pressure coefficients. Buttons are provided to select whether the doors are taped, the type of measuring device used (head or microphone), and whether or not to include a low frequency "hit" to represent sound generated by underbody flow.

Flow Regime Characterizations

The model accounts for three different flow regimes on the glass surface: vortex, reattached and turbulent boundary layer flows. The areal extent of the vortex flow can be determined from a pressure coefficient contour map, obtained either experimentally or computationally.

Figure 9A:
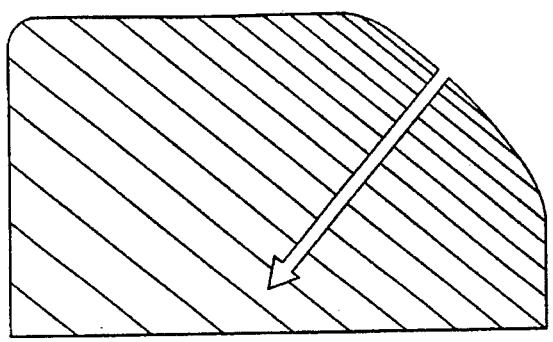
FIG. 9a is a schematic diagram illustrating a plot of Cp along a line cutting through the A-pillar.
Figure 9B:
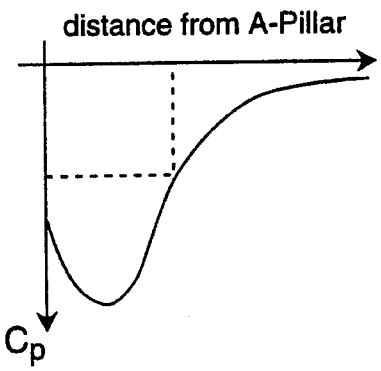
FIG. 9b is a graph of Cp versus distance from the A-pillar.

FIGS. 9a and 9b illustrate how one determines the vortex area. If one plots the $C_p$ along a line cutting through the A-pillar of FIG. 9a, the curve of FIG. 9b is obtained. The boundary of the vortex region is defined as the location where the $C_p$ drops and reaches a near level value.

The remainder of the glass surface is occupied by reattached and TBL flows. The rule is that the reattached flow exists for a distance of 100 $h_s$ where $h_s$ is defined as the maximum of the vortex height or the glass offset A-pillar height. Whatever is left over is designated as TBL flow.

The user need only specify the vortex area; the others are computed automatically.

Measuring Device Type

One can simulate two measuring devices in the WNM: a microphone and a head. The recorded SPL at the driver's ear will be different depending upon the device selected. For example, it is known that an auditory canal of about 25 mm in length is resonant at about 4 kHz. Since a head device models the outer ear we would expect this effect would be observed and would need to be accounted for.

The "default" device is a microphone; if a head is used the engineer simply needs to click on the appropriate button. A correction curve is applied that accounts for the head effect on the SPL reading.

Low Frequency Simulation Of Underbody Noise

Airflow under the vehicle generates noise in the low frequency range, typically 30–50 Hz. Technically, the appropriate thing to do is to couple an underbody acoustic simulation to the WNM. However, computing this is as difficult as the formidable unsteady external flow calculation on top. On the other hand, experiments have indicated that the maximum dB level underneath the vehicle occurs at a normalized Strouhal frequency $S_f$ between 1 and 1.5. Since $$S_f = f \cdot 1m / U_\infty,$$

this leads to the conclusion that the critical underbody frequency (in Hz) is 1 to 1.5 times the vehicle speed (in m/s). For example, at a speed of 70 mph (31.1 m/s) one would expect low frequency noise between 31 Hz and 47 Hz. Indeed, SPL plots at this speed typically reveal a local peak in this frequency range. The WNM literally adds, at the user's discretion, a Gaussian "spike" to represent this underbody contribution. FIG. 8b contains this adjustment.

Output

As illustrated in FIG. 8b, the program of the present invention instantly computes SPL (in both linear and A-weighted formats) at one-third octave frequencies between 25 and 10,000 Hz and plots them along with user-provided data for comparison. A second graph plots the difference between predicted and measured values to see where it exceeds 3 dB. It also computes integrated quantities such as the average SPL levels and the psychoacoustic parameter loudness, the latter by a procedure equivalent to the ISO 532B standard.

FIG. 8b depicts a result from one study of a vehicle. The vehicle was tested in a wind tunnel. The WNM did an excellent job of predicting the (A-weighted) SPL over the entire frequency range. The predicted average SPL agrees exactly with the measured one.

Multiple Window Surfaces

In many instances, the measured SPL can be predicted quite well using only one glass surface. The buttons in the lower right hand side of FIG. 8 are used in case two windows equally contribute to the generated sound. For example, if one is interested in predicting the SPL inside a truck, where the rear window is closer to the driver's ear than the side glass. The above analysis must be performed over both glass surfaces and then added to form the composite signal. The WNM provides an easy mechanism to do this. The user first inputs the parameters for one window, computes the SPL, and clicks on the appropriate "1" button to copy the computed values to the next page. He then inputs the parameters for the second window, recomputes and clicks on the "2" button. The two SPLs are then added appropriately and displayed against the experimental data.

The Seal Modeller

As mentioned earlier, the WNM accounts for noise transmission through the seals by providing a correction to the glass SPL curve at the critical shedding frequency over the B-pillar door gap. It is known, however, that there are additional frequencies where sound will "leak", and to account for these, a seal modeller (SM) spreadsheet, a main screen of which is shown in FIG. 10b, was developed.

The SM allows one to selectively tape sections of the vehicle and observe its effect on the sound transmitted. All of the critical frequencies described earlier are accounted for. For each of three regions, one must specify whether it is taped, the door margin and average $C_p$ over it, the number of seal walls present (2 for each "circular" seal and 1 for a cutline seal) and the degree of seal contact. Properties of the seal, consisting of the wall thickness, density and separation, must also be provided. The output is a "delta dB" curve (one for the driver and the other for the rear passenger) that is to be added literally to the taped result of the WNM. In fact, the two spreadsheets are linked so that the output of the SM will be fed directly to the WNM. This way, when one selects the untaped condition in the WNM, the results from the SM are automatically included.

Modelling Approach

The assumption made in the SM is that corrections to the WNM glass curve are to be Gaussian distributions centered at the critical seal frequencies with amplitudes and standard deviations empirically determined. Until better information can be obtained from equivalent seal modelling, the following approach is used. The noise transmission through a seal section in any of the three body regions has a maximum amplitude of 5 dB. These amplitudes are attenuated depending on the distance to the particular receiver. For example, consider the contribution at the margin shedding frequency for the case of a single "circular" seal (two seal walls). The driver would see 3 dB from the B-pillar seals, 1.5 from the A-pillar and 1 from the C-pillar. The rear passenger, on the other hand, would see 3 dB from the C-pillar, 2 from the B-pillar and 0.5 from the A-pillar. The values at the zero TL frequencies are less but a similar attenuation-with-position rule is employed. These dB levels are not constant but rather functions of vehicle speed and seal material properties (thickness and density). The standard deviation used is a function of the number of body regions open: small (a narrow Gaussian) if only one region is open and large (a wide Gaussian) if all regions are open. The procedure is to construct Gaussians at each frequency and add them up. If one of the zero TL frequencies is close to the margin shedding frequency, say, this "resonance" will be realized by the addition of the two Gaussians at nearly the same location. Finally, the degree of seal contact affects the overall distributions by scaling all amplitudes equally. Thus, if one has two seal configurations which differ only in the areal extent of contact (seal thickness, density and wall separation remaining equal) the resulting composite Gaussian curve will be scaled by a constant factor.

The method and system of the present invention provides the following features:

vortex/reattached flow over side glass;
three flow regimes permitted on side glass;
allows for side mirror input;
computes and plots SPL at ⅓ octave frequencies;
allows for experimental data input & comparison;
door taping:
    taping of all door joints,
    taping of selected door joints,
permits nonzero yaw angles;
predicts head or microphone SPL readings;
computes and plots linear & A-weighted SPLs;
computes and plots difference from experimental data;
includes low frequency "hit" from underbody flow;
computes & compares overall SPL predictions to data;
computes psychoacoustic parameter loudness;
multiple windows:
    combines SPLs from two windows,
    combines SPLs from many windows (>2),
noise transmission through seals:
    accounts for door margin vortex shedding,
    accounts for zero TL through seals,
    computes optimal seal configuration,
computes SPL at rear passenger's ear position.

The wind noise modeller package allows one to predict SPL levels in actual vehicles. If one has a clay model, early prototype, or production vehicle, static pressure measurements can be made on the surface to obtain the $C_p$ distribution. Thus, the present invention can be utilized with systems for which the input parameters are determined from wind tunnel measurements.

WNM Parameters From Experiments

Figure 10A:
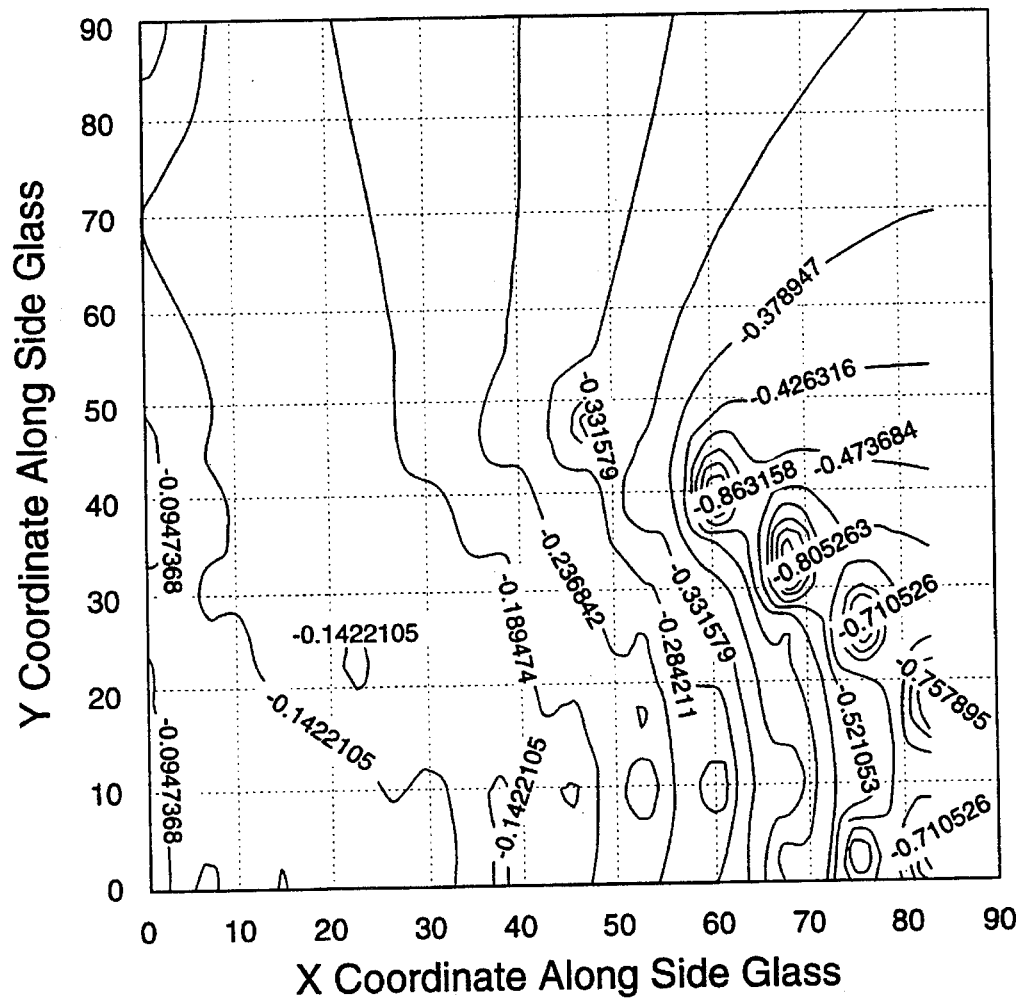
FIG. 10a is a Cp contour map on a side glass of a vehicle having a sail mount mirror, 0° yaw and a velocity of 100 mph.

Tests were conducted in a wind tunnel on a truck. Pressure taps were placed in a 3 in. square grid on the side glass and a 4 in. square grid on the cabin rear window. FIG. 10a depicts a typical pressure contour map derived from the test. Using it, the vortex region was defined to estimate its average $C_p$ value, along with other parameters needed for the WNM. Two cases were considered, and they are summarized in the following tables.

| | 55 mph & 0° Yaw | |
| --- | --- | --- |
| | Side Glass | Rear Window |
| plate dimensions | .48 × .79 m | .4 × 1.53 m |
| glass thickness | 4.2 mm | 4.2 mm |
| vortex size | 50 mm | 400 mm |
| ear distance | .355 m | .28 m |
| $<C_p>$ under vortex | −0.7 | −0.1 |
| $<C_p>$ under reattached | −0.2 | not applicable |
| vortex fractional area | 0.2 | 1.0 |

85 mph & 15° yaw

|  | Side Glass | Rear Window |
| --- | --- | --- |
| $<C_p>$ under vortex | −1.1 | −0.25 |
| $<C_p>$ under reattached | −0.3 | not applicable |
| vortex fractional area | 0.2 | 1.0 |

Figure 11A:
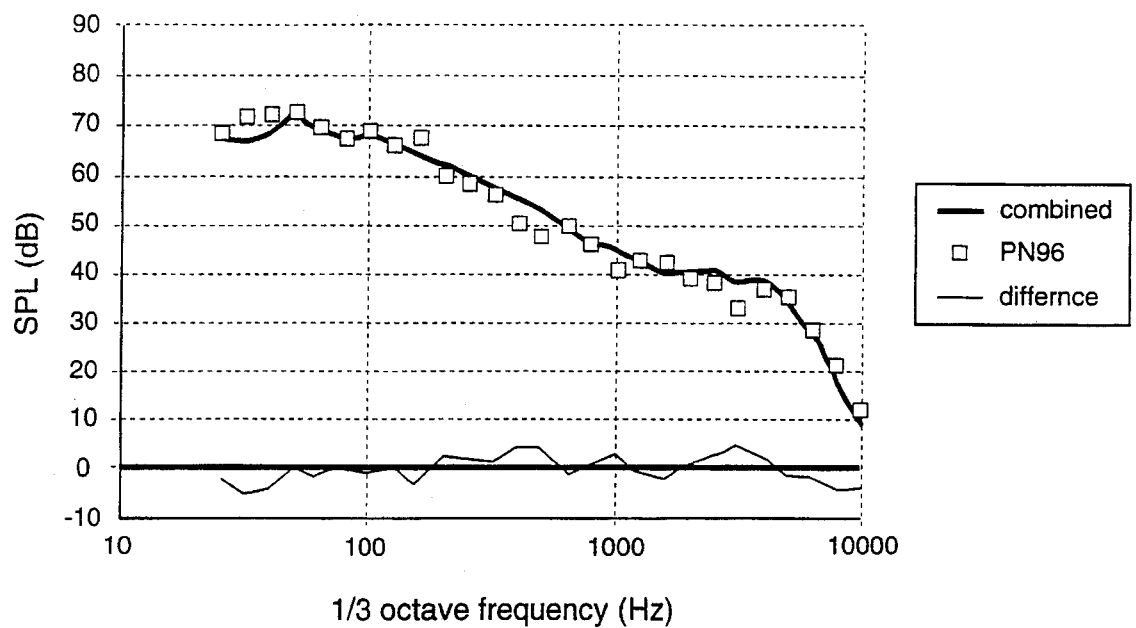
FIGS. 11a and 11b are graphs illustrating SPL versus frequency at the driver's ear due to contributions from a vehicle side and rear window at 55 mph, 0° yaw and 85 mph, and 15° yaw, respectively.
Figure 11B:
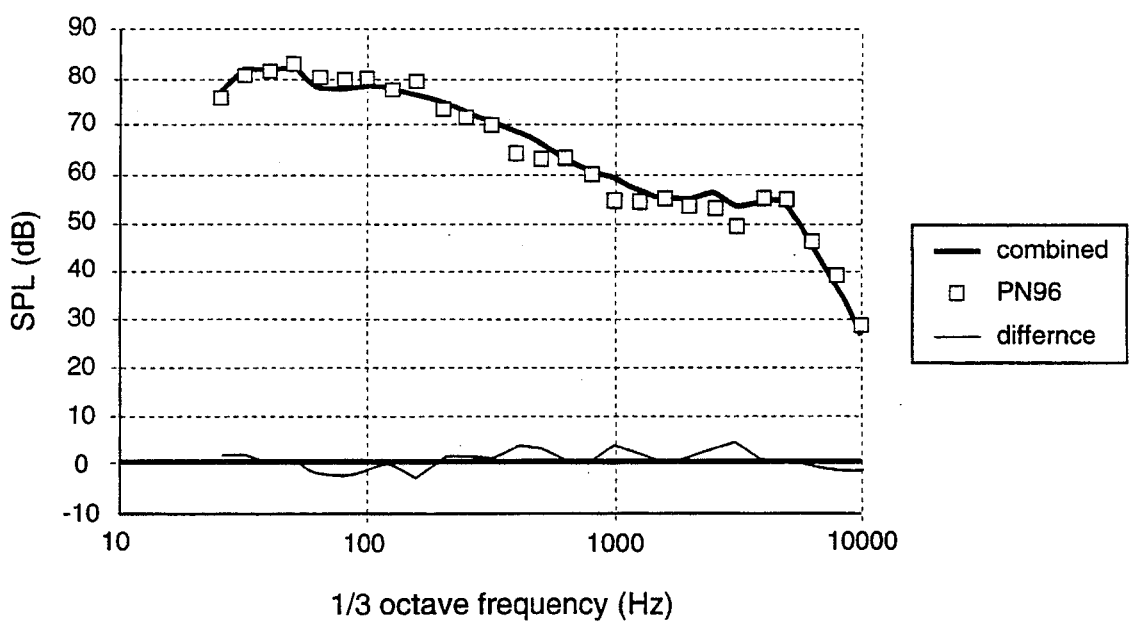

FIGS. 11a and 11b are plots of the SPLs measured in the vehicle versus the predictions of the wind noise modeller. A 5 dB low frequency correction was applied at 40 Hz in each case (taking the average estimated value of 1.25*70/2.25). The agreement is quite good over the full frequency range.

FIG. 8b shows the WNM applied to other data. Additional tests were conducted to determine the effects of local door joint taping and new seal arrangements on the SPL readings at both the driver's and rear passenger's ear positions. This data provided an opportunity to evaluate the seal modeller's capability.

Figure 12A:
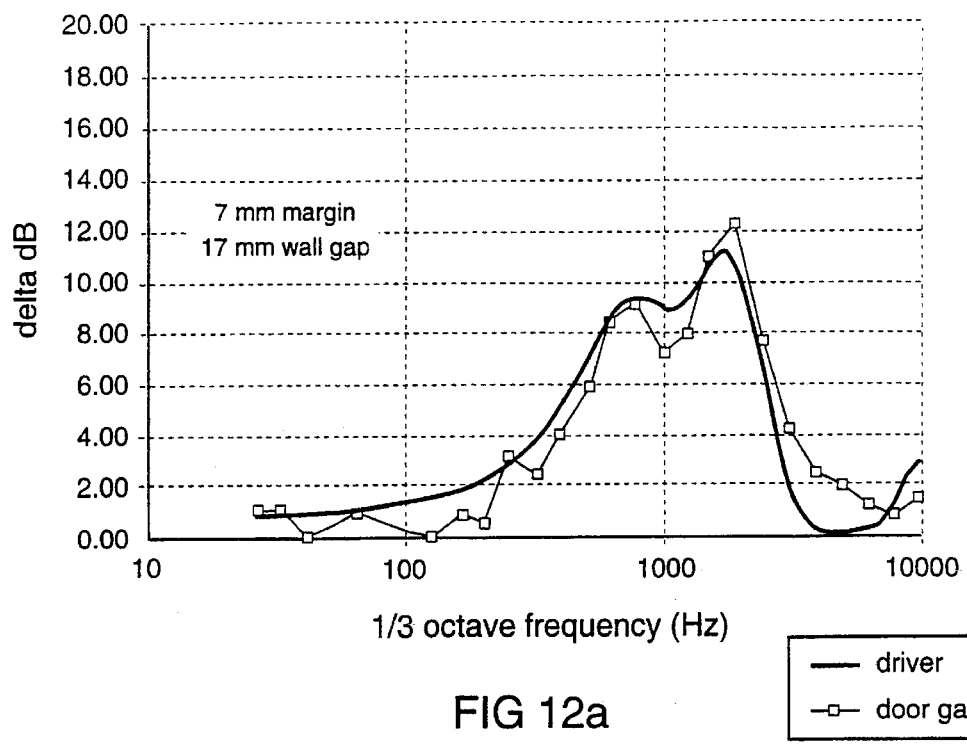
FIG. 12a is a graph of delta dB versus frequency at a vehicle's driver's position.

The first case dealt with noise transmission through the weatherstrip seal. Measurements on the vehicle gave an average margin of 7 mm, and an average seal wall separation of 17 mm. The difference between the driver's ear SPL (at 160 kph) with all door gaps open and then taped was taken. FIG. 12a plots this difference along with the prediction of the seal modeller (in all plots the predicted curve is the solid line labeled "driver"). The model correctly captures the two peaks: a major one at 1720 Hz due to margin shedding and a minor one at 680 Hz due to the zero transmission for a two-wall system. In fact, it accurately captures the delta dB over the entire frequency range.

Figure 12B:
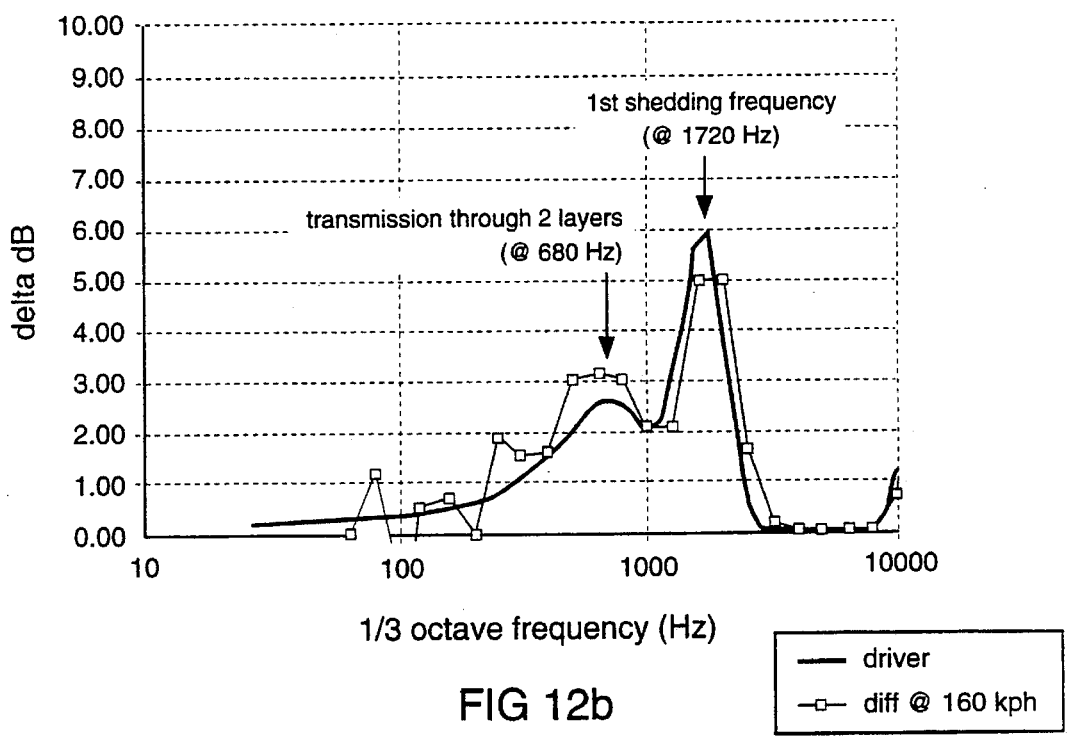
FIGS. 12b and 12c are similar to FIG. 12a with only the B-pillar open and with an additional seal, respectively.

Then all but the B-pillar door gap were taped and the test was rerun, measuring the SPL with the gap both open and taped closed. Using the SM to tape these other regions while keeping the B-pillar open, the expected difference was computed. FIG. 12b shows the result.

Figure 12C:
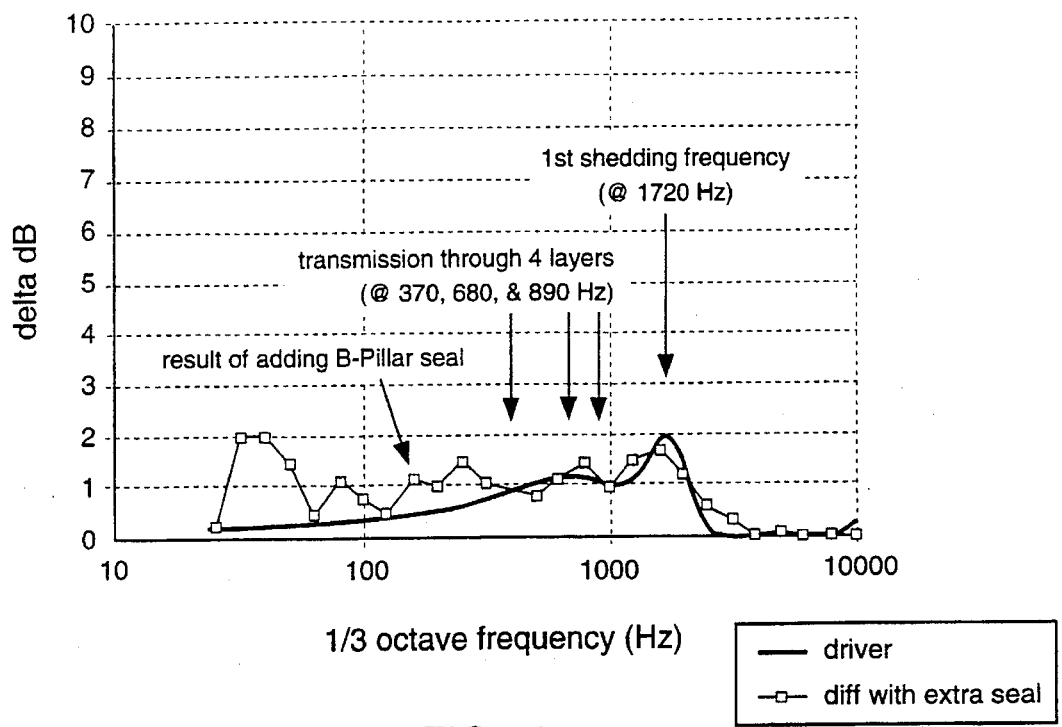

Finally, another seal along the B-pillar was added while keeping the remaining door gaps taped. This results in a four-wall system which was modelled simply by changing the number of walls parameter and keeping the rest fixed. A comparison with the prediction is shown in FIG. 12c. In each of these cases, the agreement is extremely good.

Figure 13A:
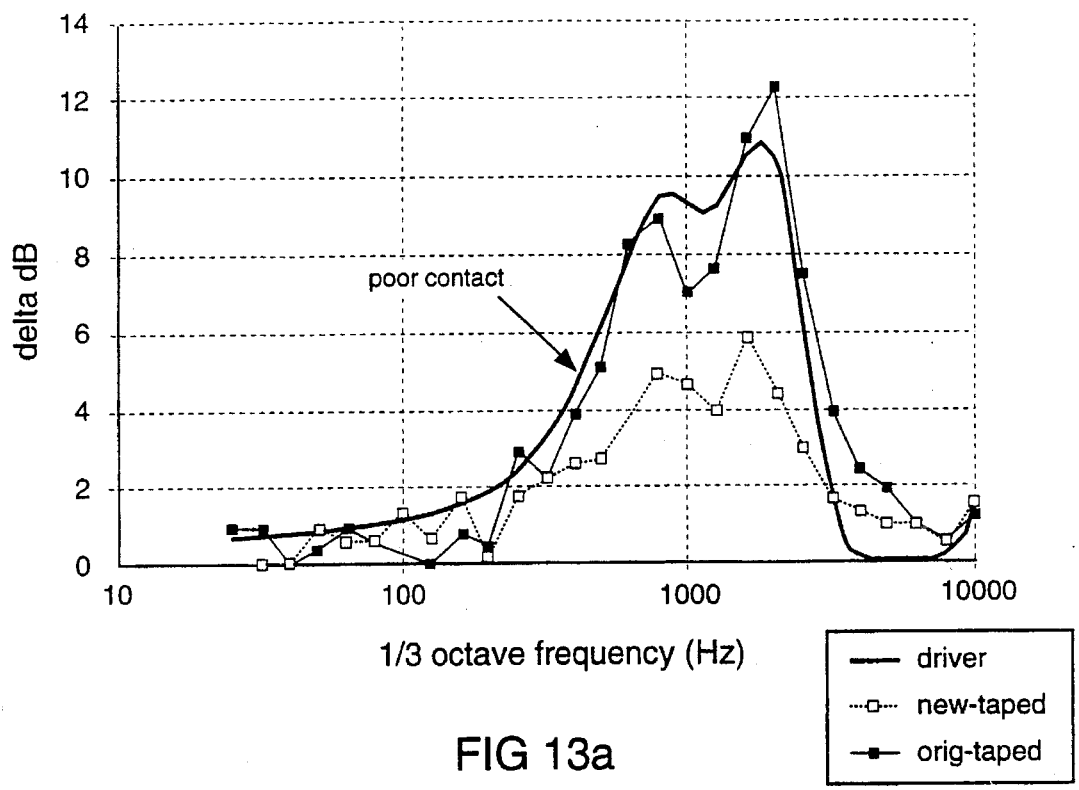
FIGS. 13a and 13b are graphs of delta dB versus frequency illustrating changes in weatherstrip design.
Figure 13B:
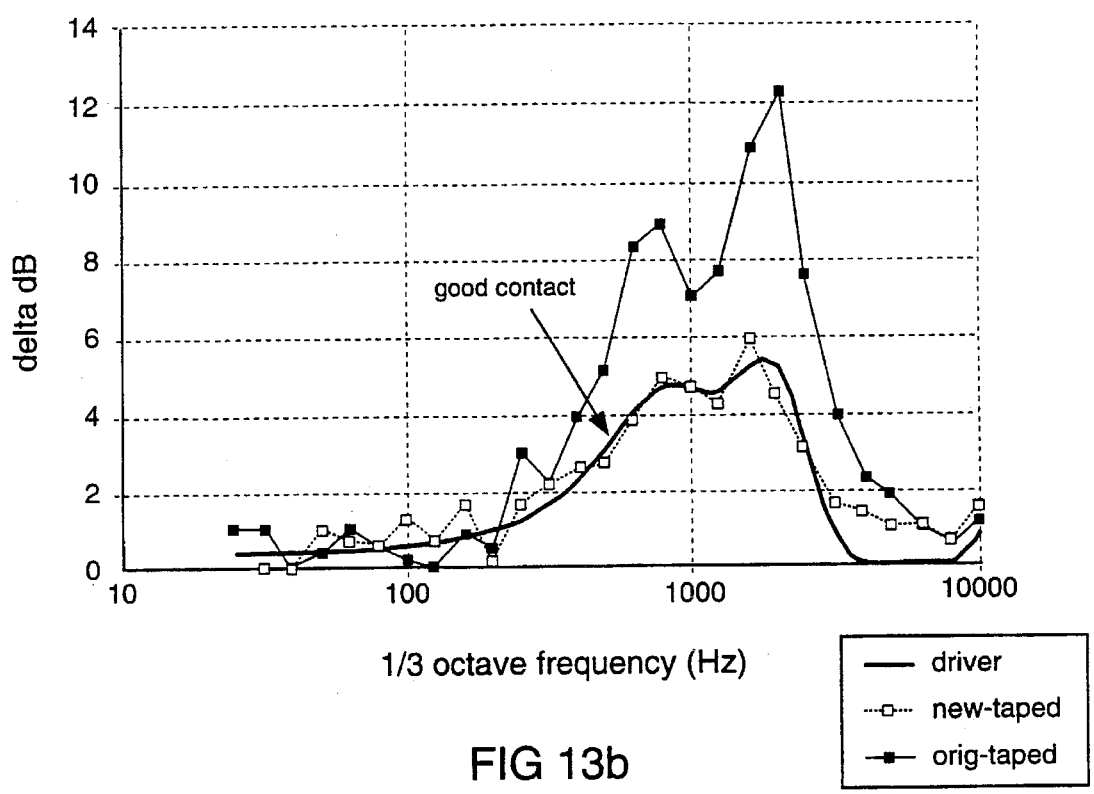

Because the additional dB through the seals was high, however, an alternate weatherstrip design was tested. This new configuration was topologically equivalent to the original one but it resulted in a greater contact surface between the seal and the body. FIGS. 13a and 13b plots the differences between the open and taped cases for both the original (black squares) and new (white squares) seal designs. Plotted with this data are the predictions of the SM. FIG. 13a gives the result for a "poor" seal contact while FIG. 13b if for a "good" contact. The two predicted curves, as well as the experimental measurements, differ by a constant scale factor (in this case, two) but retain the same two peak locations. This is to be expected since the new seal design differs from the original one primarily in the amount of surface contact and not in material properties.

Figure 14A:
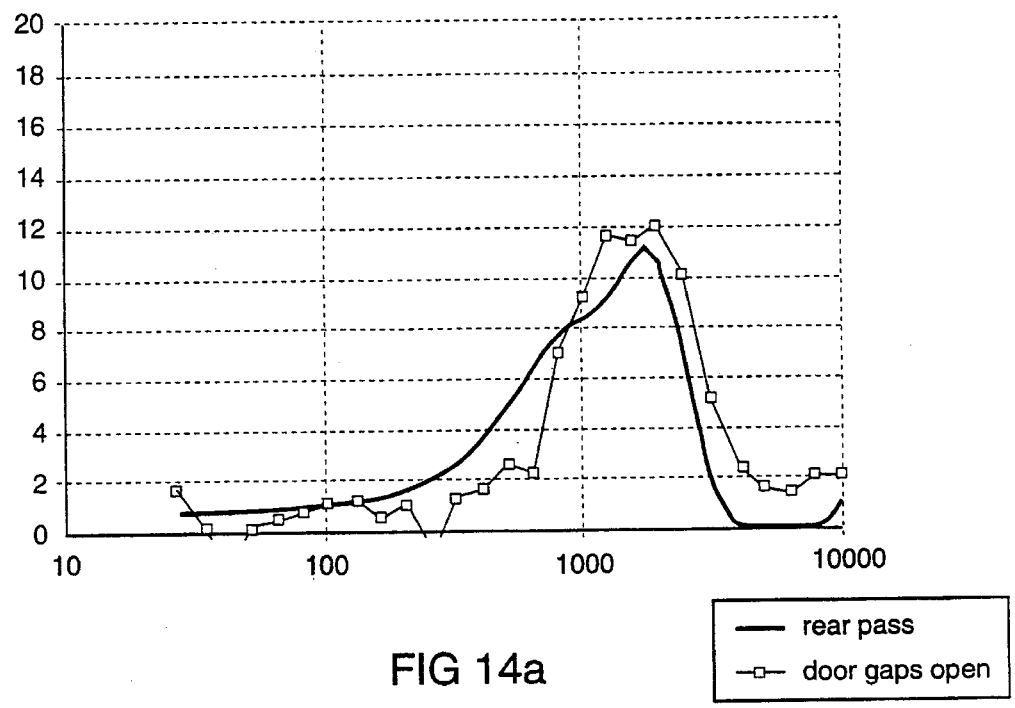
FIG. 14a is a graph of delta dB versus frequency at a rear passenger's position.
Figure 14B:
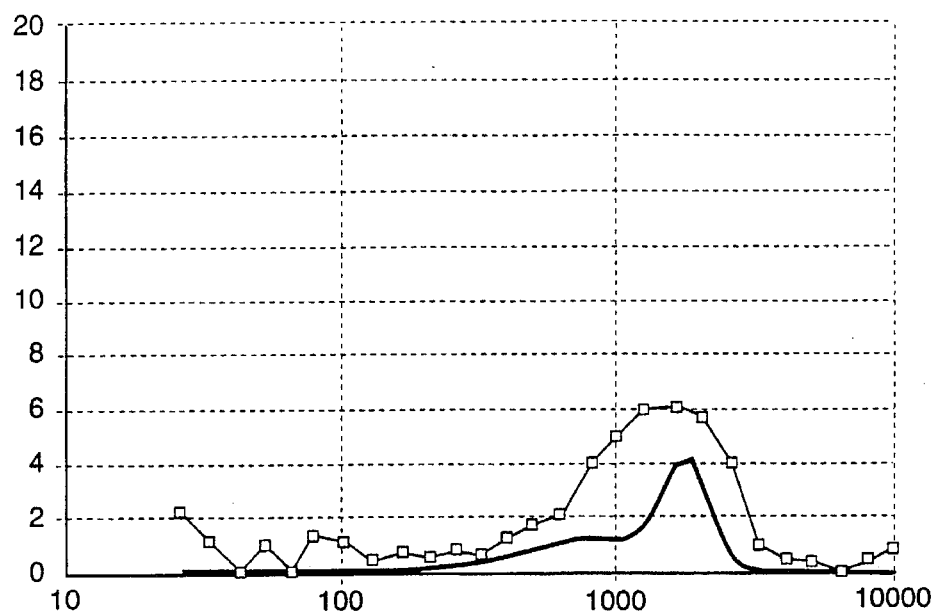
FIGS. 14b and 14c are similar to FIG. 14a with only B-pillar open and with an additional seat, respectively.
Figure 14C:
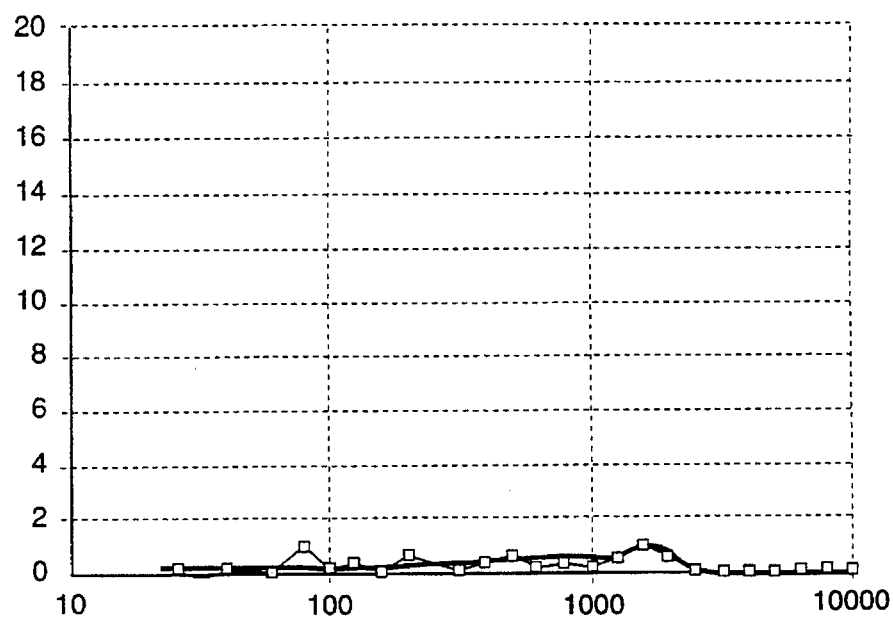

FIGS. 14a–14c are the rear passenger's ear version of FIGS. 12a–12c. The agreement, however, is still quite good.

WNM Parameters From CFD

While these results are extremely encouraging, they require information obtained from experiments and, as such, cannot be used in an up-front design process where hardware is unavailable. This is where Computational Fluid Dynamics (CFD) plays a significant role.

Figure 15:
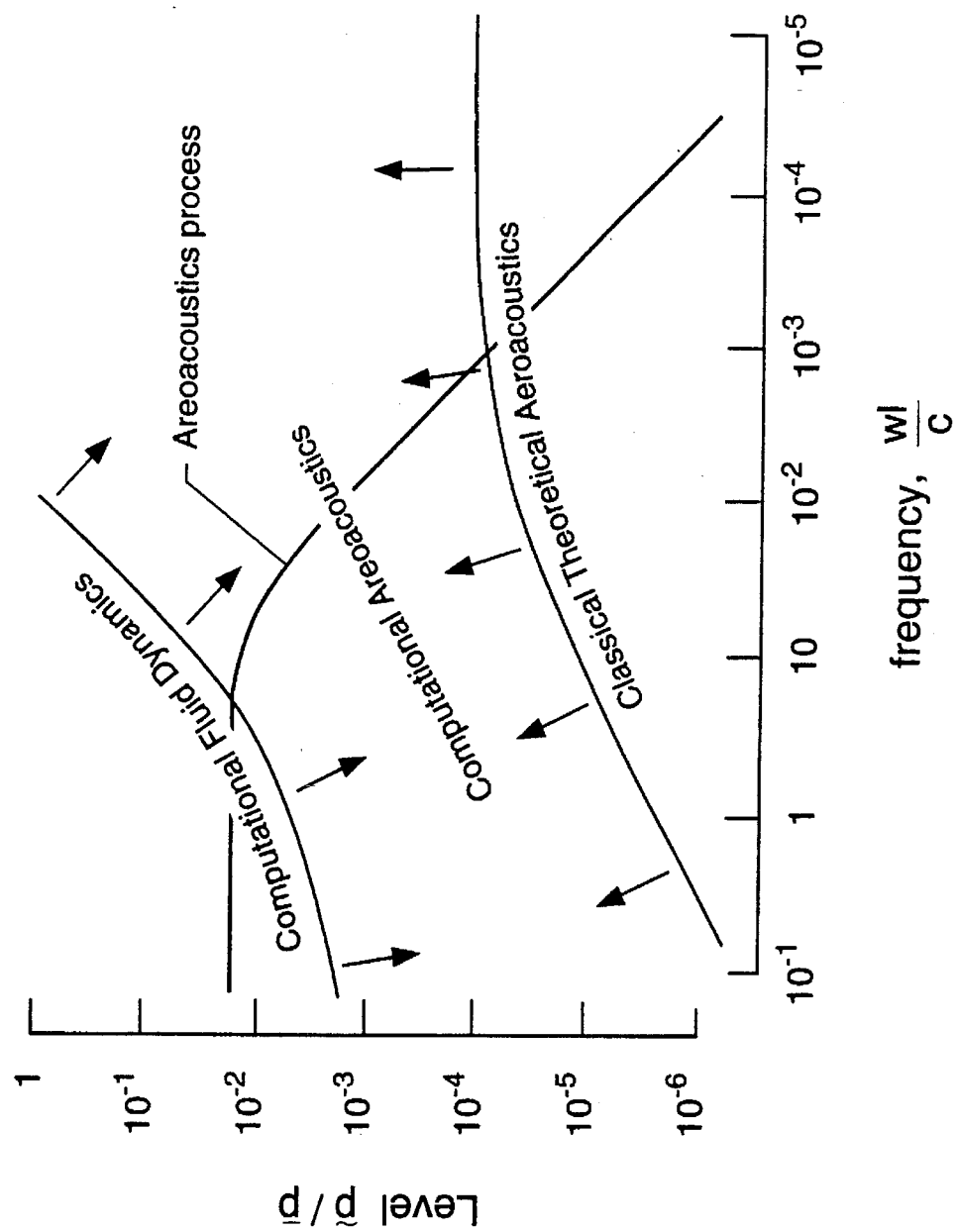
FIG. 15 is a graph of ratio of fluctuating pressure to mean pressure versus frequency.

As noted earlier, the present state of computational aeroacoustics could not predict the interior SPL level from the unsteady external airflow. To understand this better, one needs to examine the issues of levels and frequencies. FIG. 15 illustrates this point.

The "level" is defined as the ratio of the fluctuating to the mean pressure. CFD is typified by low frequencies (even zero frequency or steady state) and high levels where the dependent variables are $0(1)$. Classical acoustics are typified by low levels ($<0(10^{-4})$) and high frequencies, $0(10^2)$ to $0(10^4)$. Thus, acoustic fluctuations are three orders of magnitude smaller than hydrodynamic fluctuations. Computational Aeroacoustics can be thought of as the middle ground between these two techniques. CFD and classical aeroacoustic are both trying to expand into each other's domain. Since the typical aeroacoustic process spans the entire frequency range, one can see that neither approach can yield a complete picture today.

Unlike others who are trying to predict interior noise from a temporal simulation, the present approach requires only steady state data from CFD since the pressure spectra are already "built-in". Thus, the computational problem is considerably easier. To illustrate this, a model of a vehicle was built and a steady state calculation of the exterior flow field was performed as follows.

Computational Mesh and Procedure

Figure 16:
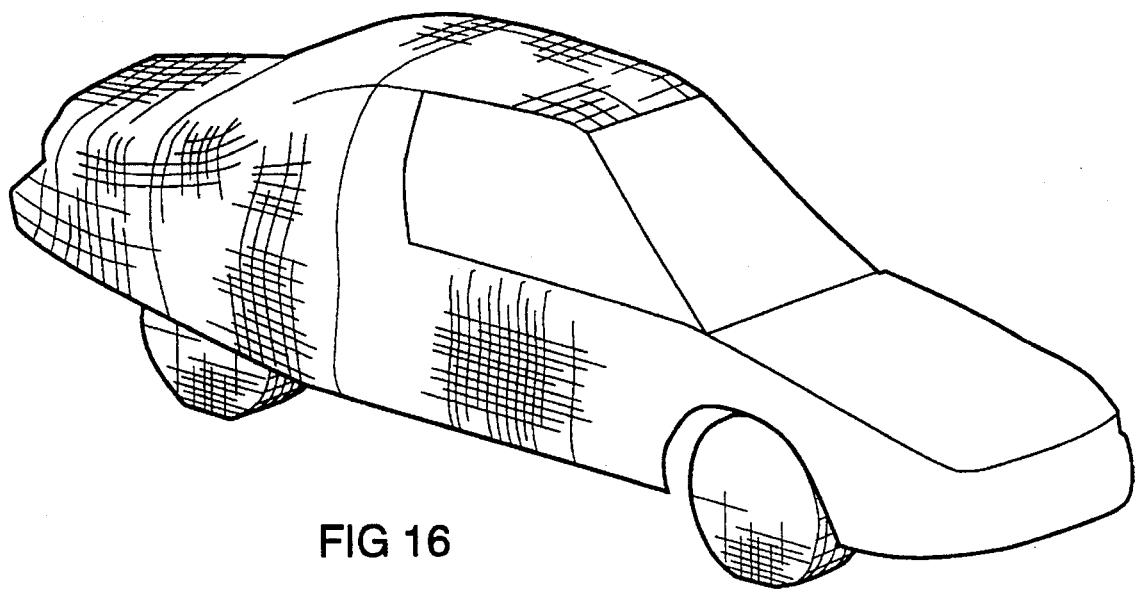
FIG. 16 is a view of the computational surface mesh from the front and above a vehicle.

Mesh cells were concentrated forward of the B-pillar, in particular around the door region, to ensure that the separation and reattachment of the A-pillar vortex would be properly captured. In order to perform a transient analysis to test the code's capabilities, a high concentration was placed around the door joints. This resulted in computational cells as small as half a millimeter in length. The resulting surface mesh on the vehicle is shown in FIG. 16.

A steady state solution was obtained using the renormalization group (RNG) turbulence model and self-filtering central differencing (SFCD). This approach appeared to give better results than the standard k-ε turbulence model with upwind differencing.

Results

Figure 17:
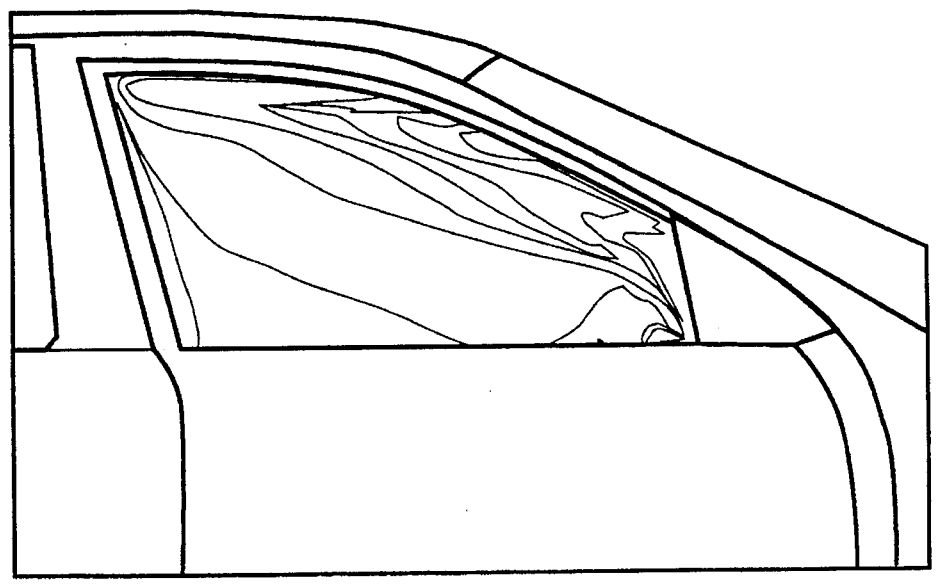
FIG. 17 is a graph illustrating computed Cp distribution on the side glass of a vehicle.
Figure 18:
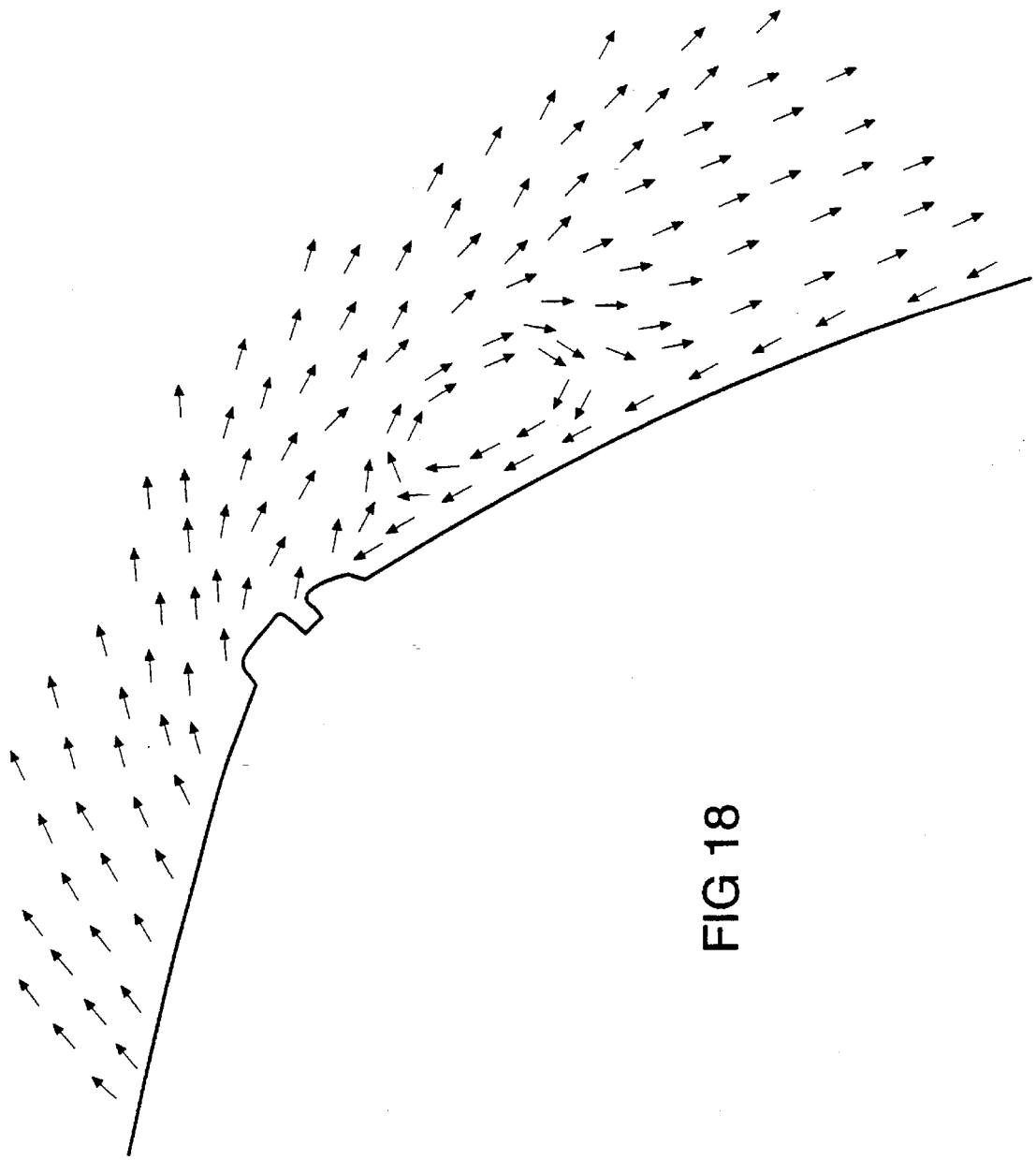
FIG. 18 is a diagram illustrating the cross-section of a vehicle showing computed A-pillar vortex.

FIG. 17 shows the computed $C_p$ distribution along the side glass. Using this, one can estimate the extent of the A-pillar vortex region and the average $C_p$ under it, as well as other parameters needed for the WNM computation. FIG. 18 (with a superimposed 20 mm square mesh) shows a vehicle cross-section from which one can estimate vortex size. The steady state results provide all the information needed for the WNM. Using these values, the SPL is predicted.

Figure 19:
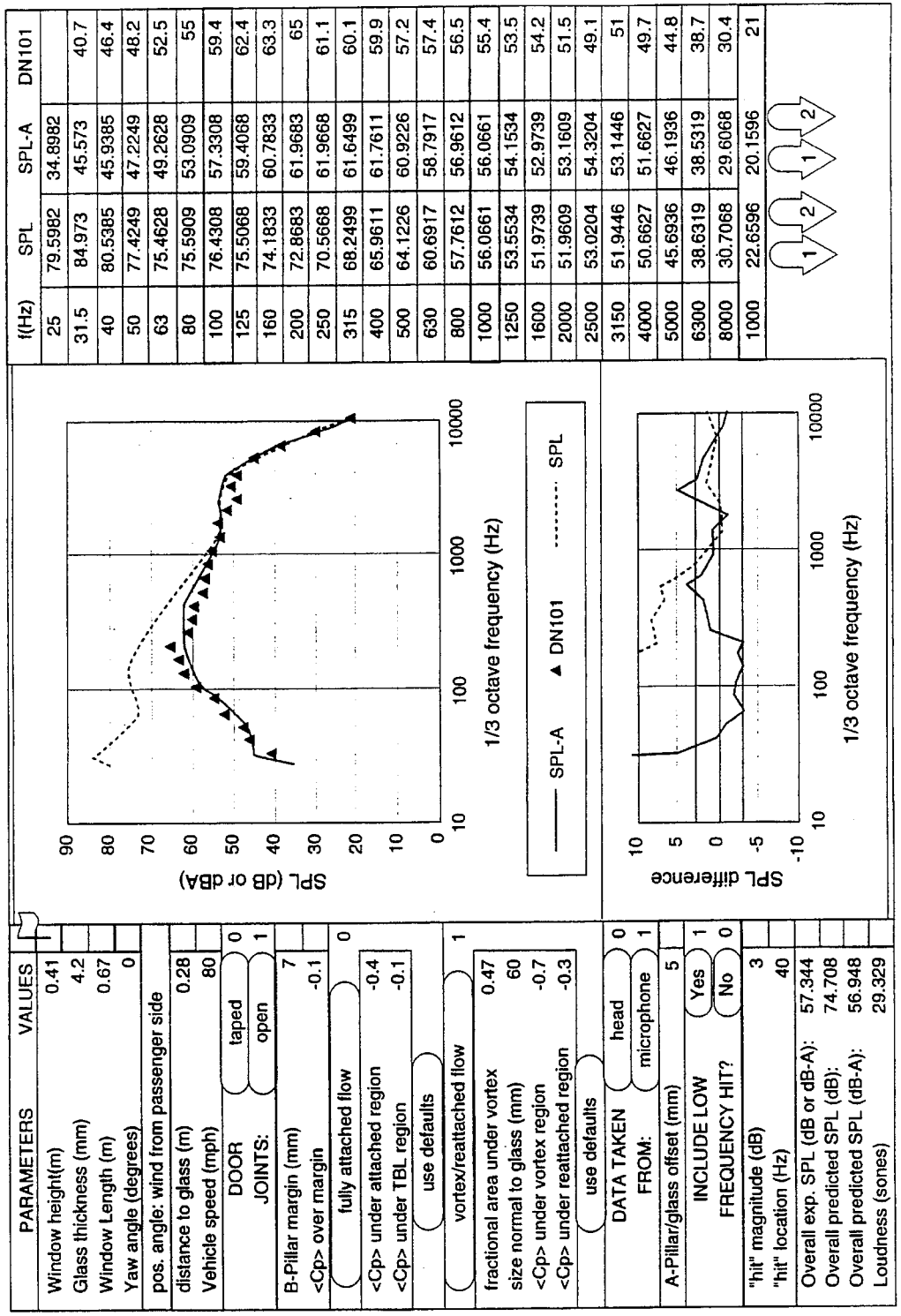
FIG. 19 illustrates a main screen of the wind noise model with parameters obtained from CFD calculation.

FIG. 19 shows the main screen with the results compared to experimental data. The agreement again is quite good. This was obtained without the need for wind tunnel tests and could have been achieved before any hardware existed. All that was required was the CAD geometry of the vehicle and an accurate steady state CFD computation.

This demonstrates how the WNM package can be used early in the design stage, as part of an up-front engineering process.

Acoustic Sensitivity Analysis

Figure 20:
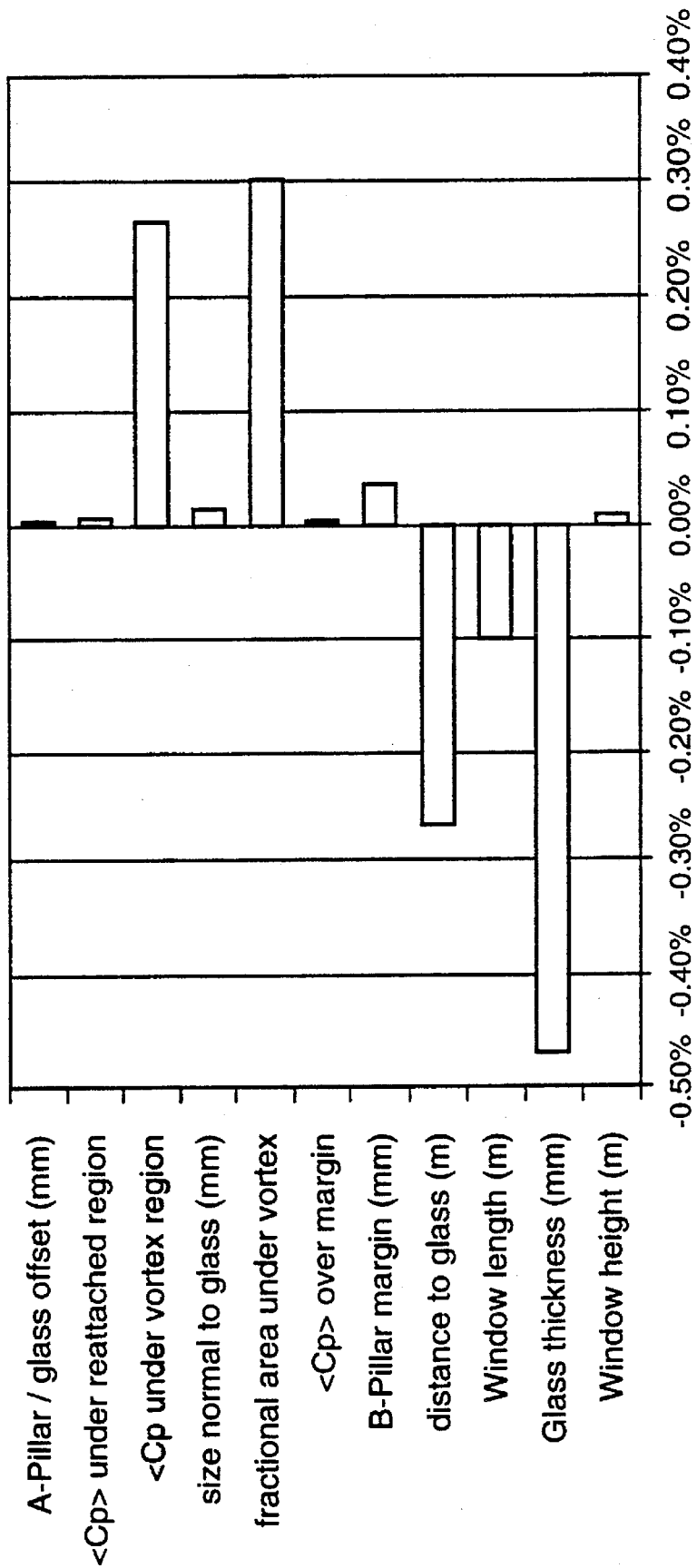
FIG. 20 is a bar graph illustrating percent effort on SPL due to a 5% increase in various design parameters.

Sensitivity is a difficult issue to address, particularly since it depends on what is being measured along with what, when, and how parameters are varied. A first look at acoustic sensitivity can be obtained by using average SPL as the metric. Vehicle data in FIG. 8 served as the "baseline". Each parameter was increased by 5% and the percent change in average SPL was computed. The results are summarized in FIG. 20.

The glass thickness produces the greatest impact, albeit less than half a percent. This was followed by the parameters characterizing the vortex region—its fractional area and $C_p$. These results make perfect sense: one can either try to dampen out the sound with a thicker glass or minimize the source of it—the A-pillar vortex.

Of course, one of the advantages of the WNM is that since it's computations are instantaneous on a PC, the user can change any parameter and see the effect immediately.

Design Optimization

Figure 21:
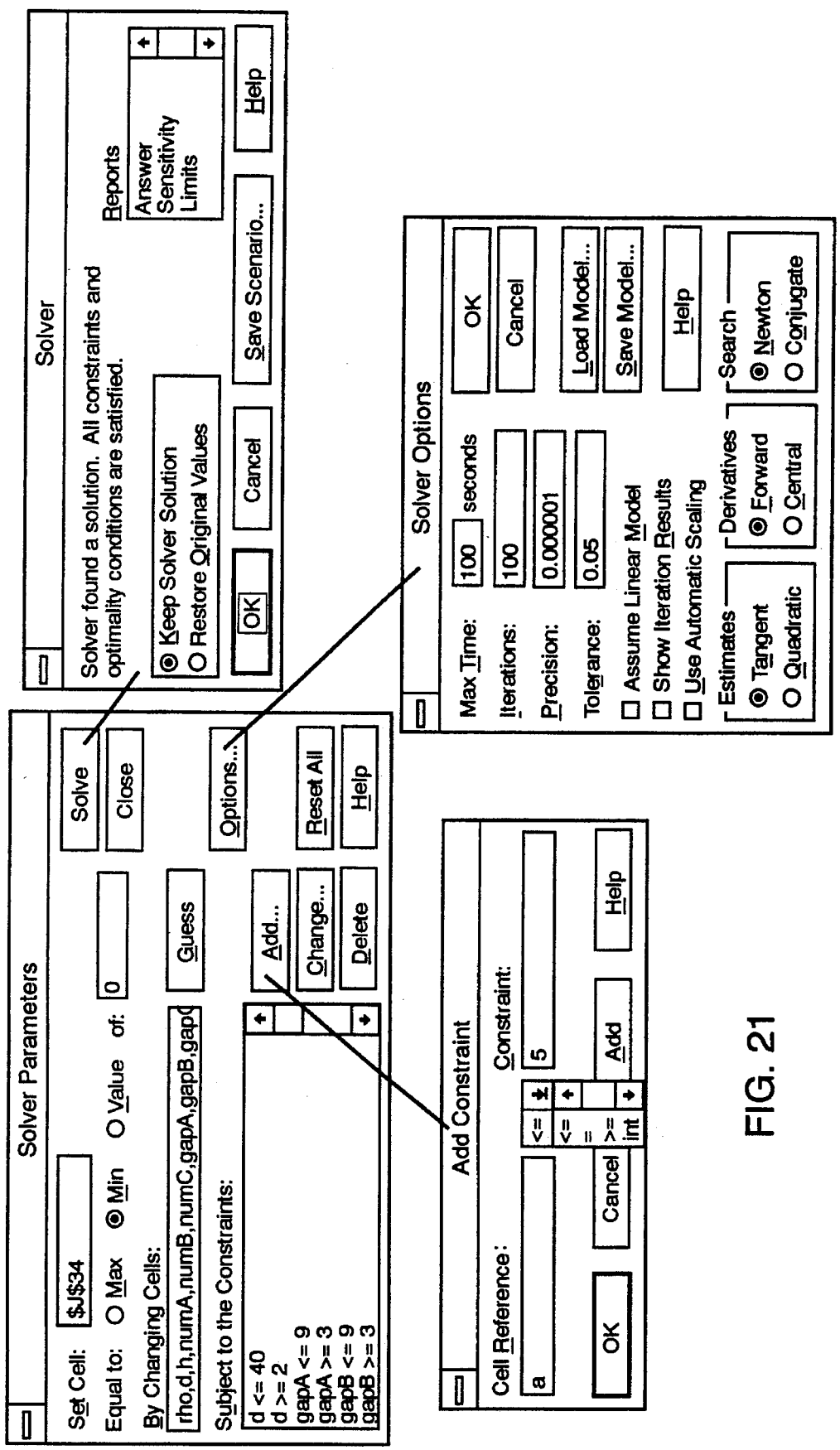
FIG. 21 is a screen which shows various dialog boxes for design optimization studies.

Since the WNM is implemented as an Excel spreadsheet, one can take advantage of the tools provided by the program. One of these, Solver, enables one to conduct minimization studies. For example, say one wants to design a seal system with the Seal Modeller that would minimize the overall additional dB level due to the seals. Alternatively, one could be interested in minimizing the maximum additional dB hit, or the dB level at a particular frequency. Design variables could include the seal thickness, density, and wall separation, the number of seals and where to put them, the door margin, etc. Just about any problem of this type can be easily constructed and solved. FIG. 21 illustrates the dialog boxes that appear to help the user set up a problem. The box in the upper left-hand corner defines the problem being analyzed; it states the cell being minimized, a list of the variables to be modified to achieve it, and constraints on these variables. One can specify the solution options in a separate dialog box, as well as define additional constraints. One constraint restricts the variable to only integer values; this would be appropriate, e.g. if one wanted the number of seal walls as a design variable.

After one click on the Solve button to find a solution, the design variables can be replaced by the new set, and obtain a set of reports. Three types can be generated automatically:

Answers Report

This summarizes the results of the calculation. It lists the original and final values for the target cell (the quantity being minimized) and the changing cells (the design variables). For each constraint, it shows if the final value of the design variable equaled the constraint, and was therefore restricted by it.

Limits Report

This lists the target and changing cells, with their values, lower and upper limits, and target results. The lower limit is the smallest value that a changing cell can take while holding all the other changing cells fixed and still satisfying the constraints. The upper limit is the greatest such value. The target result is the value of the target cell when the changing cell is at its upper or lower limit.

Sensitivity Report

This final report displays sensitivity analysis information about the optimal solution: how sensitive and optimal solution is to changes in the formulas used to calculate the target cell and the right side of the constraint equation.

For each constraint cell, the report includes the cell name, the final value of the cell, and the Lagrange multiplier for that constraint. The Lagrange multiplier measures the increase in objective per unit increase in the value that appears in the right side of the constraint equation.

Microsoft EXCEL creates each report on a separate worksheet and the user can save and/or print them. More information on the Solver and these reports can be found in the EXCEL documentation.

Summary

The Wind Noise Modeller is an analytical tool to predict interior SPL at the driver's ear due to wind noise. It is highly accurate when provided with data either from wind tunnel tests or CFD simulations. The latter approach allows one to use the WNM in an up-front design study before vehicle hardware exists.

Figure 22:
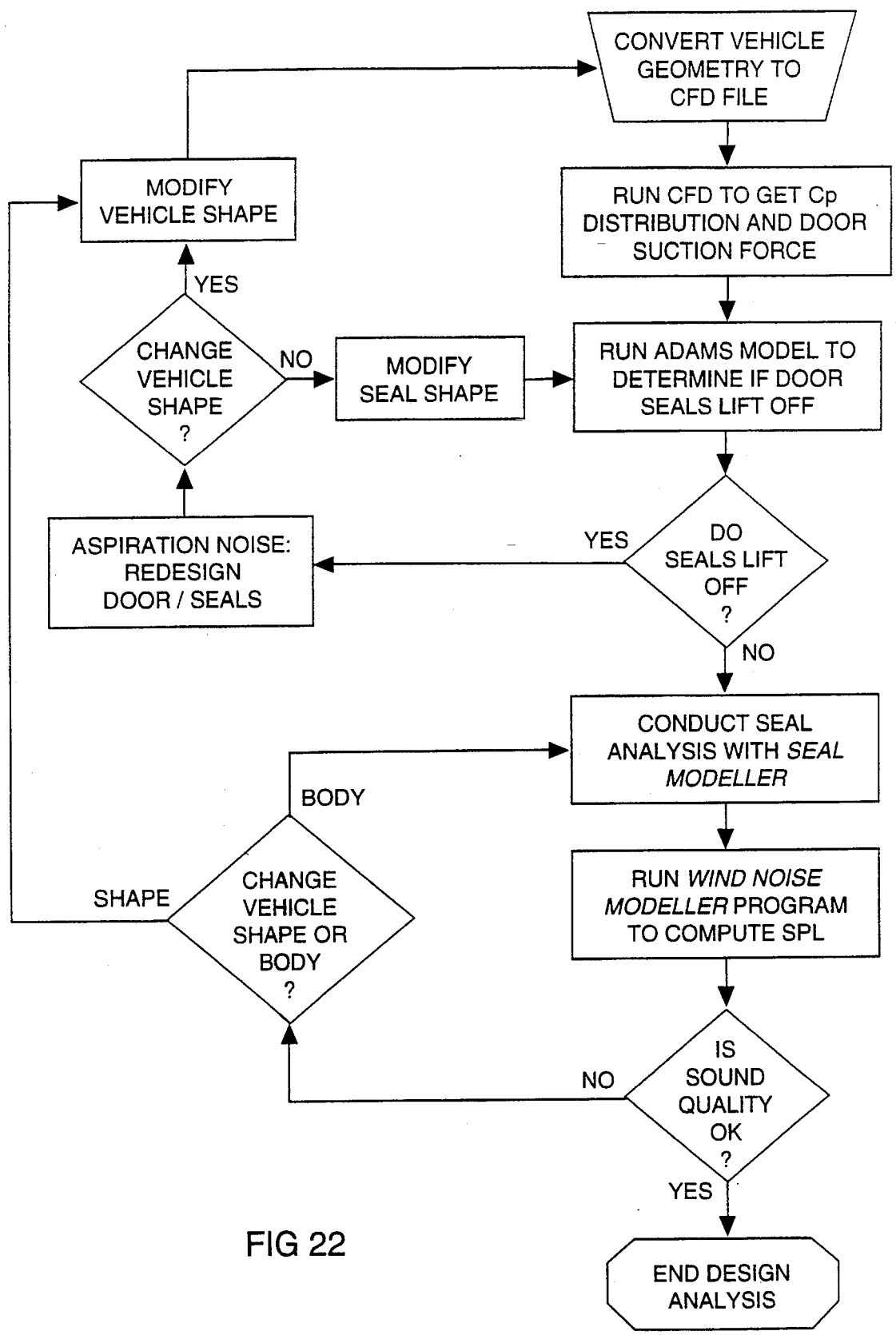
FIG. 22 is a block diagram flow chart illustrating a wind noise design process of the present invention.

The WNM package can be used as part of a wind noise design process as illustrated in FIG. 22. Starting with a vehicle geometry, one builds a CFD model and compute the exterior flow. The pressure distribution on the door and glass is used to determine the suction force pulling the door outward. This information is fed to a mechanical model of the door to see if the seals aspirate. If they do, the door and/or seals must be redesigned. If they don't, the Seal Modeller and Wind Noise Modeller are run to predict the SPL. If this level is found satisfactory, the process is complete. Otherwise, modifications must be made and the procedure iterated on.

While the best mode for carrying out the invention has been described in detail, those familiar with the art to which this invention relates will recognize various alternative designs and embodiments for practicing the invention as defined by the following claims.

What is claimed is:

1. A method for predicting sound pressure levels (SPLs) within a vehicle due to wind noise, the method using a programmable digital computer system, the method comprising the steps of:

storing in a memory of the computer system a first set of data representing geometry of at least one part of the vehicle capable of vibrating by the wind and vehicle speed;

storing in the memory a second set of data representing three distinct pressure spectra for vortex, reattached and turbulent boundary layer flows;

computing a third set of data representing the SPLs within the vehicle due to sound radiated by the at least one part into the vehicle based on the first and second sets of data; and converting the third set of data into a first set of visual indicia representing the SPLs, the step of converting including the step of displaying the visual indicia on the computer system.

2. The method as claimed in claim 1 wherein the first set of data represents geometry of at least one side window of the vehicle.

3. The method as claimed in claim 2 wherein the at least one side window is a glass window having a surface.

4. The method as claimed in claim 3 wherein the step of computing includes the steps of computing the SPLs at the surface of the glass window; and computing an attenuation factor and wherein the step of computing the third set of data is based on the SPLs at the surface of the glass window and the attenuation factor.

5. The method as claimed in claim 1 wherein the first set of visual indicia is a plot of the SPLs over a predetermined frequency range.

6. The method as claimed in claim 1 further comprising the steps of:

a) generating a set of pressure coefficients;

b) determining a vortex area from the set of pressure coefficients; and c) storing in the memory a fourth set of data representing the vortex area, the forth set of data being utilized in the step of computing.

7. The method as claimed in claim 1 wherein the vehicle includes at least one door and at least one door seal and wherein the method further comprises the step of storing in the memory a fifth set of data representing physical properties of the at least one door seal and wherein the step of computing is also based on the fifth set of data.

8. The method as claimed in claim 1 wherein the first set of visual indicia represents SPLs at a driver's ear position within the vehicle.

9. The method as claimed in claim 1 wherein the first set of visual indicia represents SPLs at a driver's ear position within the vehicle and a passenger's ear position within the vehicle.

10. A computer based system for predicting sound pressure levels (SPLs) within a vehicle due to wind noise, the system comprising:

means for generating a first set of data representing at least one part of the vehicle capable of vibrating by the wind and vehicle speed;

means for generating a second set of data representing pressure spectra for vortex, reattached and turbulent boundary layer flows;

memory means for storing the first and second sets of data;

programmed data processor means coupled to the memory means for computing a third set of data representing the SPLs within the vehicle due to sound radiated by the at least one part into the vehicle based on the first and second sets of data; and display means coupled to said processor means for displaying a first set of visual indicia representing the SPLs.

11. The system as claimed in claim 10 wherein the first set of data represents geometry of at least one side window of the vehicle.

12. The system as claimed in claim 11 wherein the at least one side window is a glass window having a surface.

13. The system as claimed in claim 12 wherein the programmed data processor means also computes SPLs at the surface of the glass window and an attenuation factor and wherein the programmed data processor means computes the SPLs within the vehicle also based on the SPLs at the surface of the glass window and the attenuation factor.

14. The system as claimed in claim 10 wherein the first set of visual indicia is a plot of the SPLs over a predetermined frequency range.

15. The system as claimed in claim 10 further comprising the steps of:

a) means for generating a set of pressure coefficients; and b) means for determining a vortex area from the set of pressure coefficients wherein the memory means also stores a forth set of data representing the vortex area, the programmed data processor means also utilizing the forth set of data to determine the SPLs within the vehicle.

16. The system as claimed in claim 10 wherein the vehicle has at least one door and at least one door seal associated with and wherein the memory means also stores a fifth set of data representing physical properties of the at least one door seal and wherein the programmed data processor means computes the third set of data also based on the fifth set of data.

17. The system as claimed in claim 10 wherein the first set of visual indicia represents SPLs at a driver's ear position within the vehicle.

18. The system as claimed in claim 10 wherein the first set of visual indicia represent SPLs at a driver's ear position within the vehicle and the passenger's ear position within the vehicle.

\* \* \* \* \*